US010468415B2

(12) United States Patent
You et al.

(10) Patent No.: US 10,468,415 B2
(45) Date of Patent: Nov. 5, 2019

(54) SEMICONDUCTOR DEVICE AND SEMICONDUCTOR PACKAGE INCLUDING THE SAME

(71) Applicant: Samsung Electronics Co., Ltd., Suwon-si, Gyeonggi-do (KR)

(72) Inventors: Hee-wook You, Suwon-si (KR); Won-chul Lee, Seongnam-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/834,203

(22) Filed: Dec. 7, 2017

(65) Prior Publication Data

US 2018/0158827 A1    Jun. 7, 2018

(30) Foreign Application Priority Data

Dec. 7, 2016 (KR) .................. 10-2016-0166209

(51) Int. Cl.
*H01L 27/108* (2006.01)
*H01L 27/02* (2006.01)
*H01L 49/02* (2006.01)

(52) U.S. Cl.
CPC .... *H01L 27/10814* (2013.01); *H01L 27/0207* (2013.01); *H01L 27/10823* (2013.01); *H01L 27/10852* (2013.01); *H01L 27/10876* (2013.01); *H01L 28/90* (2013.01); *H01L 28/91* (2013.01)

(58) Field of Classification Search
None
See application file for complete search history.

(56) References Cited

U.S. PATENT DOCUMENTS

| 8,395,235 | B2 | 3/2013 | Tsuchiya |
| 8,779,549 | B2 | 7/2014 | Kim et al. |
| 8,927,384 | B2 | 1/2015 | Kim et al. |
| 9,543,196 | B2 | 1/2017 | Park et al. |
| 9,917,147 | B2* | 3/2018 | Lee .......... H01L 28/90 |
| 2006/0211178 | A1 | 9/2006 | Kim et al. |
| 2009/0146256 | A1 | 6/2009 | Eto |

(Continued)

FOREIGN PATENT DOCUMENTS

| KR | 2012-0022032 A | 3/2012 |
| KR | 2016-0025391 A | 3/2016 |

*Primary Examiner* — Telly D Green
(74) *Attorney, Agent, or Firm* — Harness, Dickey & Pierce, P.L.C.

(57) ABSTRACT

The invention provides a semiconductor device including a capacitor capable of securing capacity and exhibiting improved reliability and a semiconductor package comprising the same. The semiconductor device includes: a substrate having a cell block; a plurality of capacitors, which are in the cell block of the substrate and have first electrodes; and a support pattern, which contacts sidewalls of the first electrodes of the plurality of capacitors and supports the plurality of capacitors, wherein the support pattern includes an upper support pattern including: a first upper pattern having a plate-like structure connected as a whole in the cell block; and a second upper pattern, which contacts a bottom surface of the first upper pattern and has a top surface having a smaller area than the bottom surface of the first upper pattern, the upper support pattern contacting sidewalls of upper ends of the first electrodes.

20 Claims, 39 Drawing Sheets

(56) References Cited

U.S. PATENT DOCUMENTS

| | | | |
|---|---|---|---|
| 2010/0155892 A1* | 6/2010 | Benson | H01L 27/10852 |
| | | | 257/532 |
| 2012/0098092 A1* | 4/2012 | Park | H01L 23/5222 |
| | | | 257/532 |
| 2013/0147048 A1* | 6/2013 | Kuh | H01L 23/49827 |
| | | | 257/768 |
| 2016/0365409 A1* | 12/2016 | Lee | H01L 28/90 |
| 2018/0182843 A1* | 6/2018 | Lee | H01L 28/90 |

* cited by examiner

SEMICONDUCTOR DEVICE AND SEMICONDUCTOR PACKAGE INCLUDING THE SAME

CROSS-REFERENCE TO RELATED APPLICATION

This application claims the benefit of Korean Patent Application No. 10-2016-0166209, filed on Dec. 7, 2016, in the Korean Intellectual Property Office, the disclosure of which is incorporated herein in its entirety by reference.

BACKGROUND

Inventive concepts relate to a semiconductor device, and more particularly, to a semiconductor device including a capacitor.

Along with the significant development of the electronics industry and user demand, electronic devices have smaller sizes and larger capacities. In particular, for a semiconductor device including a capacitor to have a high degree of integration and a large capacitance, increasing the capacitance of a capacitor is desired.

SUMMARY

Inventive concepts provide a semiconductor device including a capacitor capable of increasing capacitance and exhibiting improved reliability.

In an example embodiment of inventive concepts, there is provided a semiconductor device including a substrate having a cell block, a plurality of capacitors in the cell block, the plurality of capacitors extending in a first direction and having first electrodes, the first electrodes having upper ends further from a surface of the substrate, the first electrodes having sidewalls, and a support pattern contacting sidewalls of the first electrodes of the plurality of capacitors and configured to support the plurality of capacitors. The support pattern including an upper support pattern, the upper support pattern including a first upper pattern having a top surface and a bottom surface, the top surface and the bottom surface having a plate-like structure extending in a second direction perpendicular to the first direction and extending in a third direction perpendicular to the second direction and connected contiguously in the cell block, and a second upper pattern contacting the bottom surface of the first upper pattern and having a top surface, the top surface having a smaller surface area than a surface area of the bottom surface of the first upper pattern, the upper support pattern contacting sidewalls of upper ends of the first electrodes.

In an example embodiment of inventive concepts, there is provided a semiconductor device including a substrate having a plurality of sub-cell blocks separated from one another by a peripheral region, a plurality of capacitors in the sub-cell blocks of the substrate, the plurality of capacitors each including a cylindrical first electrode, and a second electrode, the second electrode facing the first electrode, a dielectric film between the second electrode and the first electrode, the first electrodes including upper ends further from a surface of the substrate, and a support pattern contacting outer sidewalls of upper ends of the first electrodes of the capacitors in the respective plurality of sub-cell blocks and supports the plurality of capacitors. The support pattern includes an upper support pattern including a first upper pattern contacting the outer sidewalls of the upper ends of the first electrodes and has a plate-like structure connected as a whole in each of the sub-cell blocks, and a second upper pattern contacting a portion of a bottom surface of the first upper pattern, the portion of the bottom surface of the first upper pattern being separated from an edge of the bottom surface of the first upper pattern, and a lower support pattern contacting outer sidewalls of the first electrode and closer to the surface of the substrate than the upper support pattern.

In an example embodiment of inventive concepts, there is provided A semiconductor device including a substrate, at least one dummy capacitor connected to the substrate and configured to improve manufacturing margins of the semiconductor device, at least one functional capacitor, the at least one functional capacitor connected to the substrate, the at least one functional capacitor configured to be used in an operation of the semiconductor device, at least one first upper pattern supporting the at least one functional capacitor and supporting the at least one dummy capacitor; and at least one second upper pattern supporting the at least one functional capacitor and not supporting the at least one dummy capacitor.

In example embodiments inventive concepts, since a proportion of a support pattern-contacting portion of a sidewall of a bottom, or first, electrode of a real, or functional, capacitor is relatively lower than a proportion of a support pattern-contacting portion of a sidewall of a first electrode of a dummy capacitor not directly used for the operation of the semiconductor device, the semiconductor device may have sufficient capacitance of the functional capacitor for the operation of the semiconductor device. In addition, since the proportion of the support pattern-contacting portion of the sidewall of the first electrode of the dummy capacitor is relatively higher than the proportion of the support pattern-contacting portion of the sidewall of the first electrode of the functional capacitor, the force, with which the support pattern supports the dummy capacitor, may be relatively increased.

According to the semiconductor device of inventive concepts, since the support pattern supports capacitors, which are included in a cell block, to relax stress applied to the capacitors, and the support pattern allows capacitance of the functional capacitor to be sufficiently high, a mechanical reliability and electrical reliability of the semiconductor device may be improved.

BRIEF DESCRIPTION OF THE DRAWINGS

Embodiments of inventive concepts will be more clearly understood from the following detailed description taken in conjunction with the accompanying drawings in which.

DETAILED DESCRIPTION OF THE EMBODIMENTS

For the sufficient understanding of components and effects according to inventive concepts, embodiments of inventive concepts will be described in detail with reference to the accompanying drawings.

Figure 1:
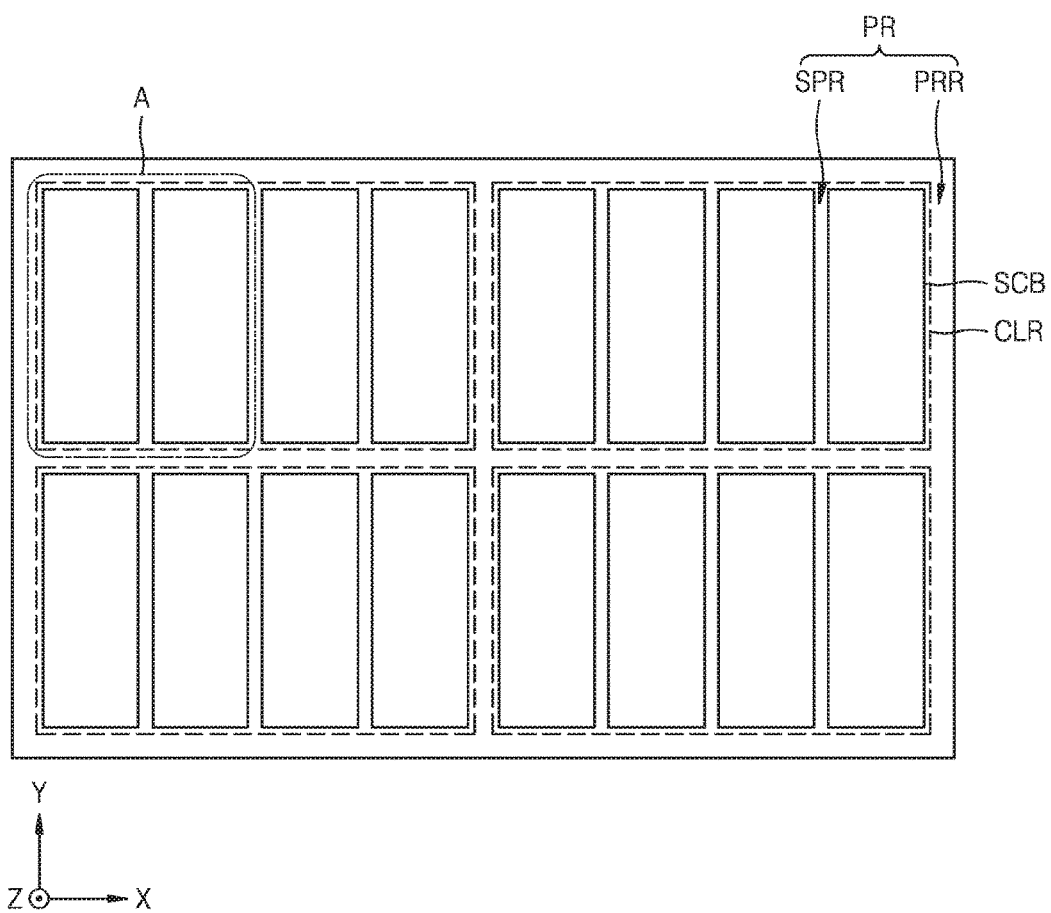
FIG. 1 is a block diagram illustrating a semiconductor device according to example embodiments.

FIG. 1 is a block diagram illustrating a semiconductor device according to example embodiments.

Referring to FIG. 1, the semiconductor device may include a cell region CLR, in which memory cells are arranged, and a main peripheral region PRR surrounding the cell region CLR.

According to an embodiment, the cell region CLR may include sub-peripheral regions SPR separating cell blocks SCB. A plurality of memory cells may be arranged in the cell blocks SCB. As used herein, the term "cell block SCB" refers to a region in which the memory cells are regularly arranged at regular intervals, and a cell block SCB may be referred to as a sub-cell block.

Logic cells allowing an electrical signal to be input to and output from the memory cells may be arranged in the main peripheral region PRR and the sub-peripheral regions SPR. In some example embodiments, the main peripheral region PRR may be referred to as a core circuit region, and a sub-peripheral region SPR may be referred to as a peripheral circuit region. A peripheral region PR including the main peripheral region PRR and the sub-peripheral regions SPR may be referred to as the core and peripheral circuit region. In some example embodiments, the sub-peripheral region SPR may be provided as a space, or only a space, for separating the cell blocks SCB.

Figure 2:
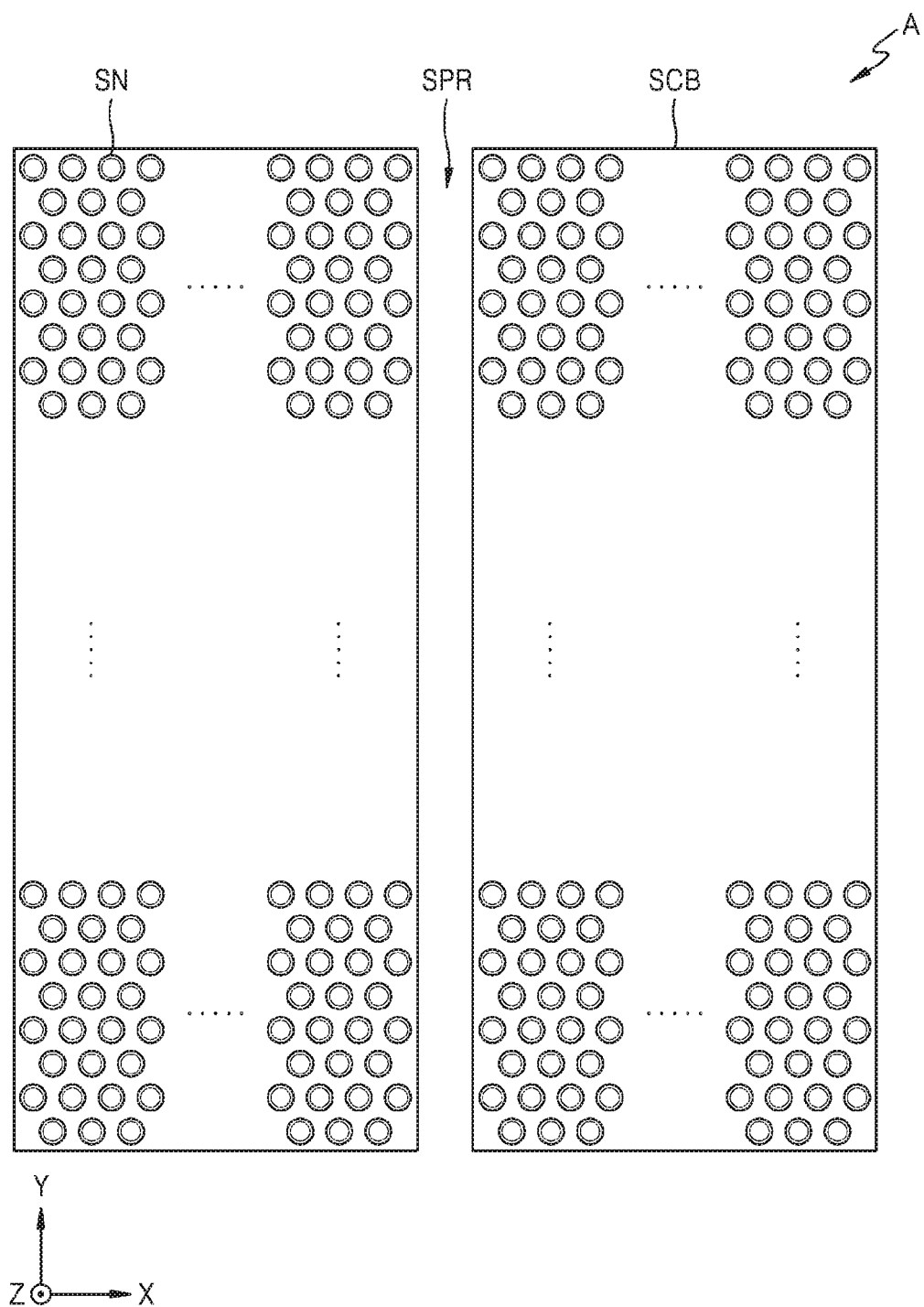
FIG. 2 is a plan view illustrating an arrangement structure of capacitors included in a semiconductor device according to example embodiments.

FIG. 2 is a plan view illustrating an arrangement structure of capacitors included in a semiconductor device according to example embodiments. FIG. 2 is an enlarged view of an area A of the cell region CLR shown in FIG. 1.

Hereinafter, a DRAM device will be described as an example of the semiconductor device. However, according to inventive concepts, the semiconductor device is not limited to the DRAM device.

Referring to FIG. 2, a plurality of storage nodes SN, which are first electrodes of a plurality of capacitors, may be arranged in the sub-cell blocks SCB. In some example embodiments, each of, or at least one of the plurality of storage nodes SN may be or may include a closed-bottom cylindrical first electrode (520 of FIG. 5). When viewed from the Z direction, the first electrode may conformally extend along the sidewalls and the bottom of the cylinder. In some example embodiments, the storage nodes SN may be arranged in a honeycomb or hexagonal shape, in which the storage nodes SN are arranged in a zigzag manner with respect to one direction. In some example embodiments, the storage nodes SN may be arranged in a matrix form; however, inventive concepts are not limited thereto.

A width of the sub-peripheral region SPR may be greater than a pitch, which is a distance between centers of two adjacent storage nodes SN in one cell block SCB. In some example embodiments, the width of the sub-peripheral region SPR may be two to five times the pitch of the storage nodes SN; however, inventive concepts are not limited thereto.

Figure 3:
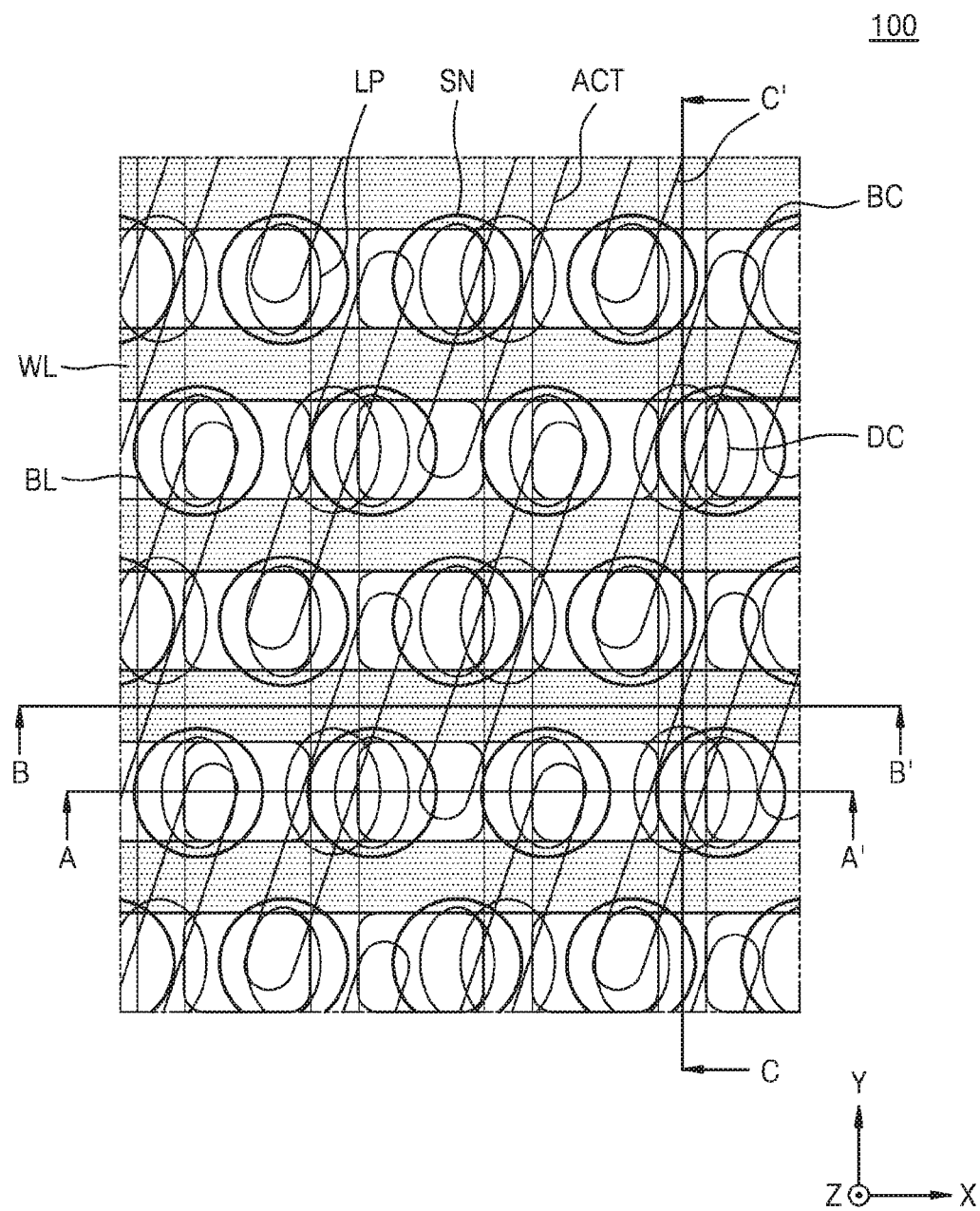
FIG. 3 is a schematic planar layout illustrating main components of a semiconductor device according to example embodiments.

FIG. 3 is a schematic planar layout illustrating main components of a semiconductor device according to example embodiments.

Referring to FIG. 3, a semiconductor device 100 may include a plurality of active regions ACT. In some example embodiments, the plurality of active regions ACT may have a long axis in a diagonal direction with respect to a first direction (X direction) and a second direction (Y direction).

A plurality of word lines WL may cross the plurality of active regions ACT and extend parallel to one another along the first direction (X direction). On the plurality of word lines WL, a plurality of bit lines BL may extend parallel to each other along the second direction (Y direction) that intersects the first direction (X direction).

The plurality of bit lines BL may be connected to the plurality of active regions ACT through direct contacts DC.

In some example embodiments, a plurality of buried contacts BC may be formed between two adjacent bit lines BL of the plurality of bit lines BL. In some example embodiments, each of, or at least one of the plurality of buried contacts BC may extend above one of the two adjacent bit lines BL. In some example embodiments, the plurality of buried contacts BC may be arranged in a row along the first direction (X direction) and the second direction (Y direction).

A plurality of landing pads LP may be respectively on the plurality of buried contacts BC. The plurality of landing pads LP may at least partially overlap the plurality of buried contacts BC. Each of, or at least one of the plurality of landing pads LP may extend above an adjacent bit line BL.

A plurality of storage nodes SN may be respectively on the plurality of landing pads LP. The plurality of storage nodes SN may be formed over the plurality of bit lines BL. The plurality of storage nodes SN may be respectively first electrodes of a plurality of capacitors. Each storage node SN may be connected to an active region ACT through a landing pad LP and a buried contact BC.

Figure 4:
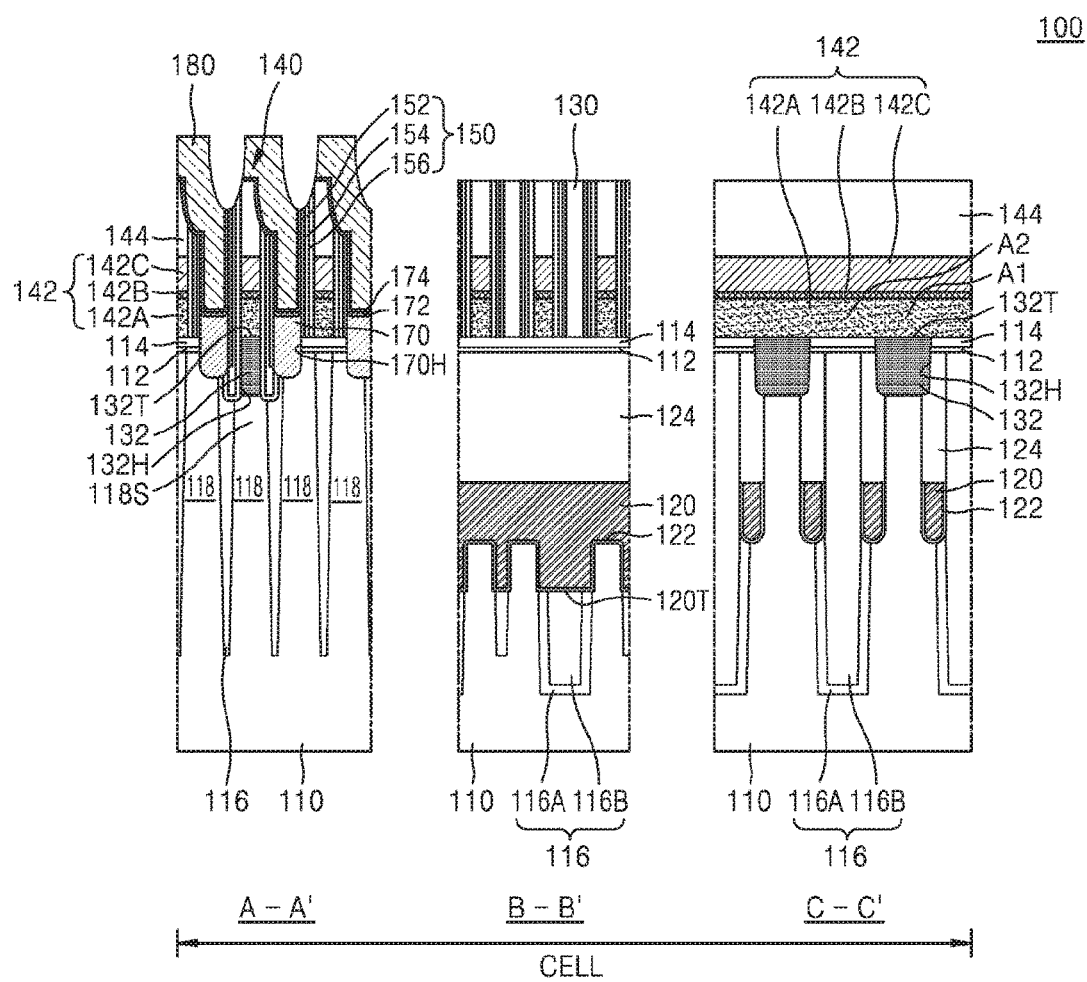
FIG. 4 shows cross-sectional views illustrating portions of a semiconductor device according to example embodiments.

FIG. 4 shows cross-sectional views illustrating portions of a semiconductor device according to example embodiments. For example, FIG. 4 shows cross-sectional views illustrating the landing pad LP and the underlying main components of the semiconductor device 100 of FIG. 3. In particular, the FIG. 4 shows portions of the cross-sectional views taken along lines A-A', B-B' and C-C' of the FIG. 3, respectively.

Referring to FIG. 4, the semiconductor device 100 includes a device isolation film 116 defining a plurality of active regions 118 in the substrate 110. The plurality of active regions 118 may respectively correspond to or include the plurality of active regions ACT shown in FIG. 3.

In some example embodiments, the substrate 110 may include silicon, for example, single-crystalline silicon, polycrystalline silicon, or amorphous silicon. In some other embodiments, the substrate 110 may include at least one selected from among germanium (Ge), silicon germanium (SiGe), silicon carbide (SiC), gallium arsenide (GaAs), indium arsenide (InAs), and indium phosphide (InP). Additionally or alternatively, the substrate 110 may include a conductive region, for example, an impurity-doped well, or an impurity-doped structure.

A plurality of trenches 120T, which extend in the first direction (X direction of FIG. 3), are formed in the substrate 110, and a plurality of gate dielectric films 122 and a plurality of word lines 120 are formed in the plurality of trenches 120T. The plurality of word lines 120 may be included in the plurality of word lines WL shown in FIG. 3.

A plurality of direct contact holes 132H, which expose portions of the active regions 118, are formed in the substrate 110. A direct contact conductive pattern 132 fills each of, or at least one of the plurality of direct contact holes 132H. A plurality of direct contact conductive patterns 132 may be included in the direct contacts DC shown in FIG. 3.

A first buffer insulating film pattern 112 and a second buffer insulating film pattern 114 are on the substrate 110 in this stated order. Each of, or at least one of the first buffer insulating film pattern 112 and the second buffer insulating film pattern 114 may include silicon oxide, silicon nitride, or combinations thereof.

A plurality of bit lines 142, which extend parallel to one another in the second direction (Y direction of FIG. 3), are on the second buffer insulating film pattern 114. The plurality of bit lines 142 may correspond to the plurality of bit lines BL shown in FIG. 3. The plurality of bit lines 142 may be respectively connected to the active regions 118 through the direct contact conductive patterns 132.

In some example embodiments, each of, or at least one of the plurality of direct contact conductive patterns 132 may have a top surface 132T, which extends on the same plane as a top surface of the second buffer insulating film pattern 114.

In some example embodiments, the plurality of direct contact conductive patterns 132 may include silicon (Si), germanium (Ge), tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or combinations thereof. In some example embodiments, the plurality of direct contact conductive patterns 132 may include an epitaxial silicon layer.

Each of, or at least one of the plurality of bit lines 142 includes a first conductive pattern 142A, which contacts the top surface 132T of the direct contact conductive pattern 132. In some example embodiments, each of, or at least one of the plurality of bit lines 142 may further include a second conductive pattern 142B and a third conductive pattern 142C, covering the first conductive pattern 142A in this stated order. Although each of the plurality of bit lines 142 is shown in FIG. 4 as having a triple-layer stacked structure, which includes the first conductive pattern 142A, the second conductive pattern 142B, and the third conductive pattern 142C, inventive concepts are not limited thereto. For example, each of, or at least one of the plurality of bit lines 142 may have a stacked structure, which includes a single layer, double layers, or a plurality of layers including four or more layers.

In some example embodiments, the first conductive pattern 142A may include conductive polysilicon. In some example embodiments, the second conductive pattern 142B may include titanium nitride (TiN). In some example embodiments, the third conductive pattern 142C may include tungsten (W).

An insulating capping line 144 may be on each of, or at least one of the plurality of bit lines 142. One bit line 142 and one insulating capping line 144 covering the one bit line 142 may be included in one bit line structure 140.

An insulating spacer structure 150 may cover both sidewalls of each of, or at least one of a plurality of bit line structures 140. Each of, or at least one of a plurality of insulating spacer structures 150 may include a first insulating spacer 152, a second insulating spacer 154, and a third insulating spacer 156. In some example embodiments, each of, or at least one of the first insulating spacer 152, the second insulating spacer 154, and the third insulating spacer 156 may include an oxide film, a nitride film, or combinations thereof. In some other embodiments, each of, or at least one of the first insulating spacer 152 and the third insulating spacer 156 may include an oxide film, a nitride film, or combinations thereof, and the second insulating spacer 154 between the first insulating spacer 152 and the third insulating spacer 156 may include an air spacer.

A plurality of insulating patterns 130 and a plurality of buried contact holes 170H may be respectively formed in spaces between the plurality of bit lines 142, the plurality of buried contact holes 170H being respectively defined by the plurality of insulating patterns 130. Each of, or at least one of the plurality of buried contact holes 170H may have an internal space defined by the insulating spacer structure 150 and a portion of the active region 118, the insulating spacer structure 150 being between two adjacent bit lines 142 of the plurality of bit lines 142 and covering a sidewall of each of, or at least one of the two adjacent bit lines 142.

A plurality of buried contacts 170 and a plurality of landing pads 180 are formed in the plurality of buried contact holes 170H between the plurality of bit lines 142, the plurality of buried contacts 170 and the plurality of landing pads 180 being respectively connected to the plurality of active regions 118. The plurality of buried contacts 170 and the plurality of landing pads 180 may correspond to the plurality of buried contacts BC and the plurality of landing pads LP shown in FIG. 3, respectively.

The plurality of buried contacts 170 may extend from the active regions 118 in a third direction (Z direction in FIG. 3) that is perpendicular to a surface of the substrate 110. The plurality of landing pads 180 may be respectively arranged on the plurality of buried contacts 170, and may extend over the plurality of bit lines 142. The plurality of landing pads 180 may be connected to the active regions 118 through the buried contacts 170.

The landing pads 180 may extend, between the plurality of bit lines 142, in the third direction (Z direction in FIG. 3) that is perpendicular to a main surface of the substrate 110, and may cover at least portions of top surfaces of the plurality of bit lines 142 to vertically overlap at least portions of the plurality of bit lines 142.

A metal silicide film 172 may be formed between the buried contact 170 and the landing pad 180. The metal silicide film 172 may include cobalt silicide (CoSix), nickel silicide (NiSix), or manganese silicide (MnSix), although inventive concepts are not limited thereto. A conductive barrier film 174 may be between the landing pad 180 and the insulating spacer structure 150 and between the landing pad 180 and a bit line structure 140. The conductive barrier film 174 may include a metal, a conductive metal nitride, or combinations thereof. For example, the conductive barrier film 174 may include a Ti/TiN stacked structure.

Figure 5:
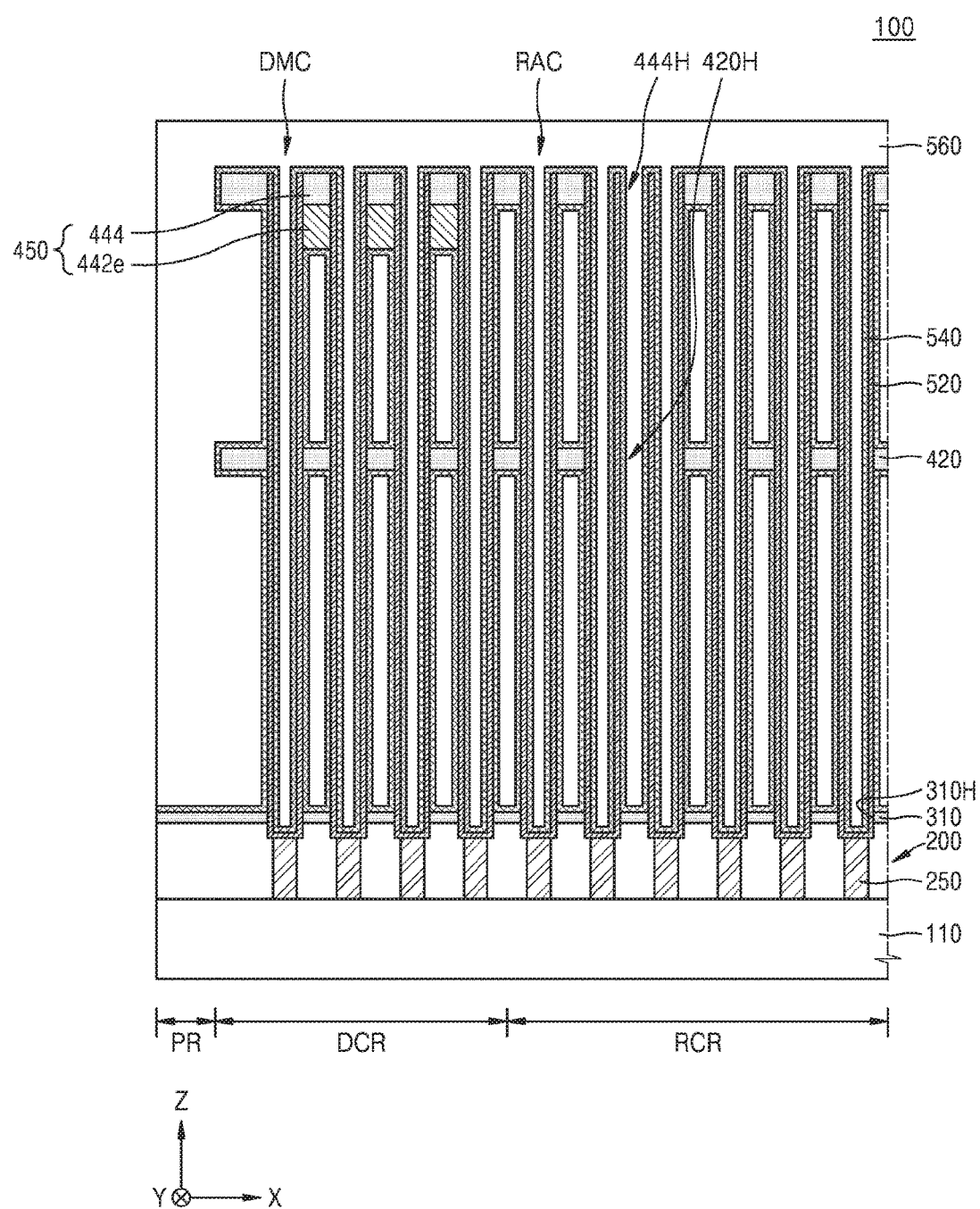
FIG. 5 is a cross-sectional view illustrating main components of a semiconductor device according to an example embodiment.

FIG. 5 is a cross-sectional view illustrating main components of a semiconductor device according to an embodiment. For example, FIG. 5 is a cross-sectional view illustrating main components over the landing pad LP of the semiconductor device 100.

Referring to FIG. 5, the semiconductor device 100 may include a lower structure 200 on the substrate 110, and a plurality of contact plugs 250 connected to the substrate 110 through the lower structure 200.

The substrate 110, the lower structure 200, and the plurality of contact plugs 250 may schematically illustrate the substrate 110 and the components in and on the substrate 110 shown in FIG. 4. In this case, the semiconductor device 100 may be or may include a semiconductor memory device such as a DRAM device, which has a capacitor, or a plurality of capacitors, for storing data.

The plurality of contact plugs 250 may include the plurality of buried contacts 170 and the plurality of landing pads 180, which are shown in FIG. 4. Each of, or at least one of the plurality of contact plugs 250 may further include the metal silicide film 172 and the conductive barrier film 174, which are shown in FIG. 4. In some example embodiments, the lower structure 200 may further include an interlayer dielectric, which fills spaces between the plurality of landing pads 180.

In some example embodiments, the lower structure 200 may be an interlayer dielectric including an insulating material. In this case, the semiconductor device 100 may be or may include a semiconductor device having a capacitor for storing charges.

The substrate 110 may have a real, or functional, capacitor region RCR, a dummy capacitor region DCR, and a peripheral region PR. The functional capacitor region RCR and the dummy capacitor region DCR may be included in the cell block SCB shown in FIG. 1. The peripheral region PR may be or may include the main peripheral region PRR and/or the sub-peripheral region SPR shown in FIG. 1.

A plurality of functional capacitors RAC may be arranged in the functional capacitor region RCR, and a plurality of dummy capacitors DMC may be arranged in the dummy capacitor region DCR. Since the plurality of functional capacitors RAC and the plurality of dummy capacitors DMC may be simultaneously, or contemporaneously, formed, the plurality of functional capacitors RAC and the plurality of dummy capacitors DMC may have the same configuration. The plurality of functional capacitors RAC may be directly used for the operation of the semiconductor device 100. For example, the plurality of functional capacitors RAC may store charge for memory cells of a DRAM device. A memory cell of a DRAM device may include a capacitor and a transistor, and a functional capacitor RAC may correspond to a capacitor of a memory cell of a DRAM device The plurality of dummy capacitors DMC may not be directly used for the operation of the semiconductor device 100. The plurality of dummy capacitors DMC may be used to improve the manufacturing margins of the semiconductor device 100; for example, the plurality of dummy capacitors DMC may be used to improve photolithography and/or etch margins during the manufacturing of the semiconductor device 100. The plurality of dummy capacitors DMC may be used to provide mechanical support for the semiconductor device 100; however, inventive concepts are not limited thereto.

For example, the plurality of functional capacitors RAC may be arranged in an inner region of the cell block (SCB of FIGS. 1 and 2), and the plurality of dummy capacitors DMC may be arranged in an outer region of the cell block (SCB of FIGS. 1 and 2) to surround the plurality of functional capacitors RAC. The plurality of dummy capacitors DMC are arranged to surround the plurality of functional capacitors RAC, and thus may be used to minimize or reduce a process deviation caused in the process of forming the plurality of functional capacitors RAC and to secure the structural reliability of the plurality of functional capacitors RAC.

An etch stop film 310 may be on the lower structure 200 of the substrate 110, the etch stop film 310 having through-holes 310H respectively corresponding to the plurality of contact plugs 250. The etch stop film 310 may include, for example, a silicon nitride film or silicon boron nitride (SiBN).

In some example embodiments, the through-holes 310H may extend beyond a bottom surface of the etch stop film 310 toward the substrate 110. In this case, top surfaces of the plurality of contact plugs 250 may be at a lower level than the bottom surface of the etch stop film 310. In some example embodiments, the top surfaces of the plurality of contact plugs 250 and the bottom surface of the etch stop film 310 may be at the same level.

A plurality of first electrodes 520 may be formed, the plurality of first electrodes 520 contacting the top surfaces of the plurality of contact plugs 250 and extending above the etch stop film 310 through the through-holes 310H. In some example embodiments, each of, or at least one of the plurality of first electrodes 520 may have a closed-bottom cylindrical shape. In some example embodiments, each of, or at least one of the plurality of first electrodes 520 may have an inside-filled column shape with a circular horizontal cross-section, for example, a pillar shape.

The plurality of first electrodes 520 may include, for example, impurity-doped silicon, a metal such as tungsten or copper, and/or a conductive metal compound such as titanium nitride.

Among the plurality of first electrodes 520, the first electrodes 520 in the functional capacitor region RCR may be first electrodes of the functional capacitors RAC, and the first electrodes 520 in the dummy capacitor region DCR may be first electrodes of the dummy capacitors DMC.

Support patterns 450 and 420 may contact sidewalls of the plurality of first electrodes 520. The support patterns 450 and 420 may support a plurality of capacitors RAC and DMC including the plurality of first electrodes 520 and including the functional capacitors RAC and the dummy capacitors DMC.

The support patterns 450 and 420 may include an upper support pattern 450 and a lower support pattern 420. The upper support pattern 450 and the lower support pattern 420 may be separated from each other.

The upper support pattern 450 may contact sidewalls of upper ends of the plurality of first electrodes 520. The upper ends may be the ends of the plurality of first electrodes further from the surface of the substrate 110. The lower support pattern 420 may contact sidewalls under the upper ends of the plurality of first electrodes 520. The lower support pattern 420 may contact sidewalls of the plurality of first electrodes 520 closer to the surface of the substrate than the upper support pattern 450.

In some example embodiments, a top surface of the upper support pattern 450 may be at the same level as uppermost ends of the plurality of first electrodes 520. In some example embodiments, the uppermost ends of the plurality of first electrodes 520 may protrude upwards from the top surface of the upper support pattern 450. For example, the top surface of the upper support pattern 450 may be at a lower level than the uppermost ends of the plurality of first electrodes 520.

The lower support pattern 420 may contact the sidewalls of the plurality of first electrodes 520 in the vicinity of vertically middle portions of the plurality of first electrodes 520. In some example embodiments, the lower support pattern 420 may contact the sidewalls of the plurality of first electrodes 520 at a somewhat higher level than vertically middle points of the plurality of first electrodes 520. In some example embodiments, the lower support pattern 420 may contact the sidewalls of the plurality of first electrodes 520 at a somewhat lower level than the vertically middle points of the plurality of first electrodes 520.

Although one lower support pattern 420 is shown in FIG. 5 as being formed at a lower level than the upper support pattern 450 in a vertical direction to the main surface of the substrate 110, inventive concepts are not limited thereto. In some example embodiments, the lower support pattern may include a plurality of lower support patterns 420, which are at different levels in the vertical direction to the main surface of the substrate 110 and are separated from one another.

In some example embodiments, the lower support pattern 420 may be omitted.

The upper support pattern 450 may include a first upper pattern 444 and a second upper pattern 442e. The first upper pattern 444 and the second upper pattern 442e may include different materials from one another. In some example embodiments, the first upper pattern 444 may include a silicon nitride film or a silicon carbon nitride (SiCN) film. In some example embodiments, the second upper pattern 442e may include an N-rich silicon nitride (N-rich SiN) film or a Si-rich silicon nitride film.

The first upper pattern 444 may have a plate-like structure connected as a whole in the cell block (SCB of FIGS. 1 and 2). The plate-like structure may extend in the X and Y directions. The first upper pattern 444 may contact the sidewalls of first electrodes in the functional capacitor region RCR and the dummy capacitor region DCR. For example, the first upper pattern 444 may simultaneously support the plurality of functional capacitors RAC and the plurality of dummy capacitors DMC.

The first upper pattern 444 may have a first upper opening 444H, which extends from a top surface to a bottom surface of the first upper pattern 444 and penetrates the first upper pattern 444. The top surface and the bottom surface of the upper patterns may correspond to the top surface and the bottom surface extended in the Z direction.

The first upper pattern 444 may horizontally protrude from outermost first electrodes 520, which are adjacent to the peripheral region PR among the plurality of first electrodes 520, toward the peripheral region PR.

The second upper pattern 442e may contact the first upper pattern 444. A top surface of the second upper pattern 442e may contact the bottom surface of the first upper pattern 444. The second upper pattern 442e may be separated from an edge of the bottom surface of the first upper pattern 444 and the first upper opening 444H, and the top surface of the second upper pattern 442e may contact an inner portion of the bottom surface of the first upper pattern 444.

Accordingly, the planar area, e.g. the planar surface area, of the second upper pattern 442e may be less than the planar area of the first upper pattern 444. For example, the area of the top surface of the second upper pattern 442e may be less than the area of the bottom surface of the first upper pattern 444.

Here, an edge of the first upper pattern 444 or the edge of the bottom surface of the first upper pattern 444 refers to the edge of the first upper pattern 444, which faces a peripheral region PR side. Thus, an edge of the second upper pattern 442e, which faces the peripheral region PR side, may be further inside the cell region (SCB of FIGS. 1 and 2) than the edge of the first upper pattern 444, which faces the peripheral region PR side. For example, the edge of the first upper pattern 444 may correspond to an edge of the upper support pattern 450 when viewed from the Z direction.

In some example embodiments, the second upper pattern 442e may contact and support all or some of the first electrodes 520 of the plurality of dummy capacitors DMC.

In some example embodiments, the second upper pattern 442e may contact the first electrodes 520 of some functional capacitors RAC adjacent to the dummy capacitor region DCR among the plurality of functional capacitors RAC, and may simultaneously support at least some of the plurality of dummy capacitors DMC as well as some functional capacitors RAC adjacent to the dummy capacitor region DCR. The second upper pattern 442e may not support at least one of the functional capacitors.

Therefore, in the upper support pattern 450 including the first upper pattern 444 and the second upper pattern 442e, the thickness of a portion of the upper support pattern 450, in which the second upper pattern 442e is formed, may be greater than the thickness of a portion of the upper support pattern 450, in which only the first upper pattern 444 is formed. For example, the thickness of a portion of the upper support pattern 450, which is adjacent to an edge of the cell block SCB, may be greater than the thickness of the other portions of the upper support pattern 450, for example, the thickness of a portion of the upper support pattern 450, which contacts the edge of the cell block SCB, and the thickness of a portion of the upper support pattern 450 in the inner region of the cell block SCB.

A planar shape of the first upper pattern 444 is transferred to the lower support pattern 420, whereby the lower support pattern 420 may have the same planar shape as the first upper pattern 444. The lower support pattern 420 may have a first lower opening 420H, which extends from a top surface to a bottom surface of the lower support pattern 420 and penetrates the lower support pattern 420. The first lower opening 420H may overlap the first upper opening 444H in a vertical direction. In some example embodiments, the horizontal cross-sectional area of the first lower opening 420H may be less than the horizontal cross-sectional area of the first upper opening 444H, and in this case, the first lower opening 420H may wholly overlap the first upper opening 444H. The lower support pattern 420 may horizontally protrude from the outermost first electrodes 520, which are adjacent to the peripheral region PR among the plurality of first electrodes 520, toward the peripheral region PR.

A dielectric film 540 may conformally cover the support patterns 450 and 420 and the first electrodes 520. In some example embodiments, the dielectric film 540 may simultaneously conformally cover the etch stop film 310, the support patterns 450 and 420, and the first electrodes 520. The dielectric film 540 may include, for example, TaO, TaAlO, TaON, AlO, AlSiO, HfO, HfSiO, ZrO, ZrSiO, TiO, TiAlO, BST ((Ba,Sr)TiO), STO (SrTiO), BTO (BaTiO), PZT (Pb(Zr,Ti)O), (Pb,La)(Zr,Ti)O, Ba(Zr,Ti)O, Sr(Zr,Ti)O, or combinations thereof.

A top, or second, electrode 560 may be on the dielectric film 540. The second electrode 560 may face the first electrodes 520 with the dielectric film 540 therebetween. The second electrode 560 may include, for example, doped silicon, Ru, RuO, Pt, PtO, Ir, IrO, SRO (SrRuO), BSRO ((Ba,Sr)RuO), CRO (CaRuO), BaRuO, La(Sr,Co)O, Ti, TiN, W, WN, Ta, TaN, TiAlN, TiSiN, TaAlN, TaSiN, or combinations thereof.

Figure 6A:
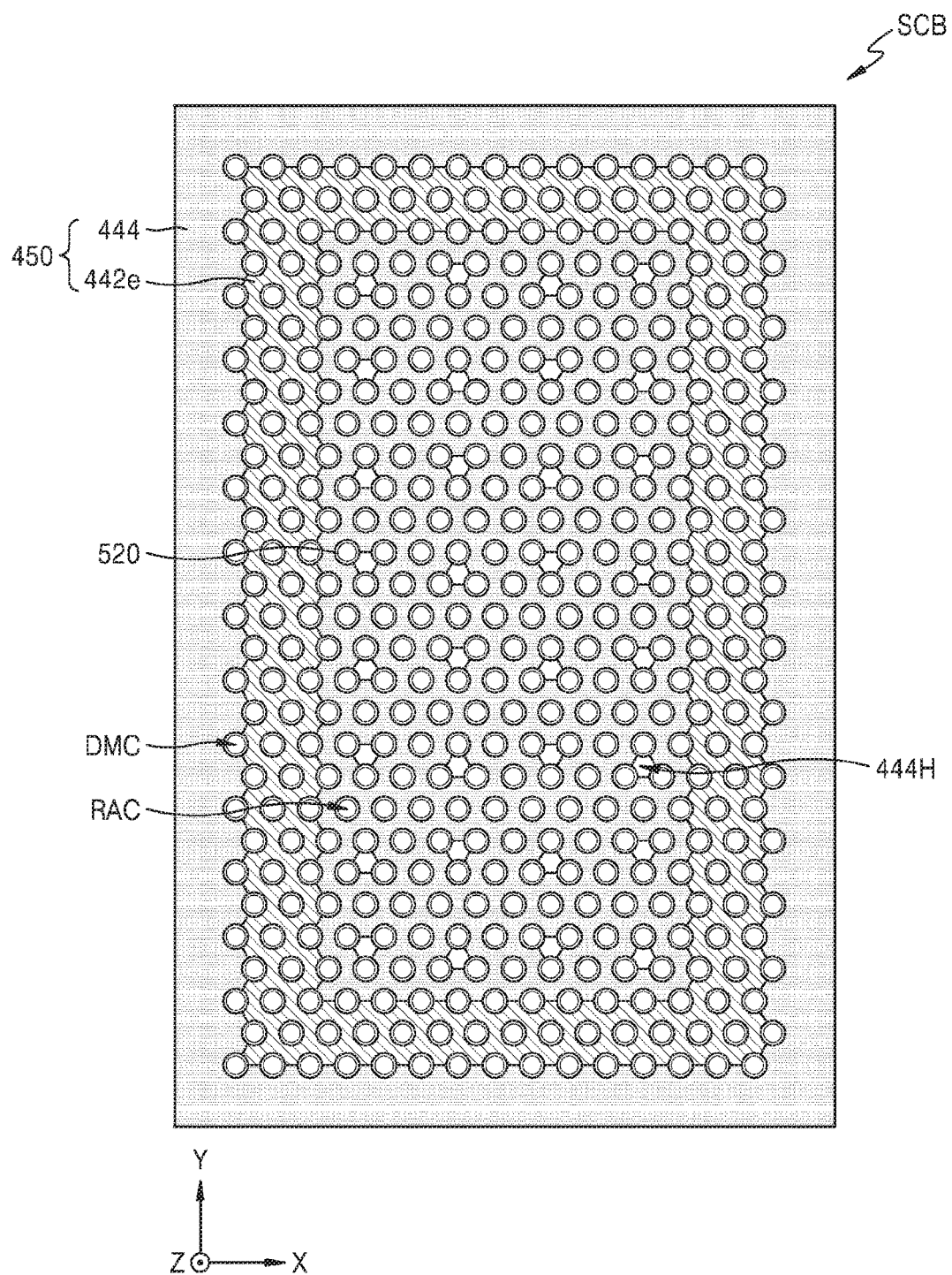
FIGS. 6A to 6C are plan views illustrating an arrangement structure of capacitors and a support pattern included in a semiconductor device according to an embodiment example.
Figure 6B:
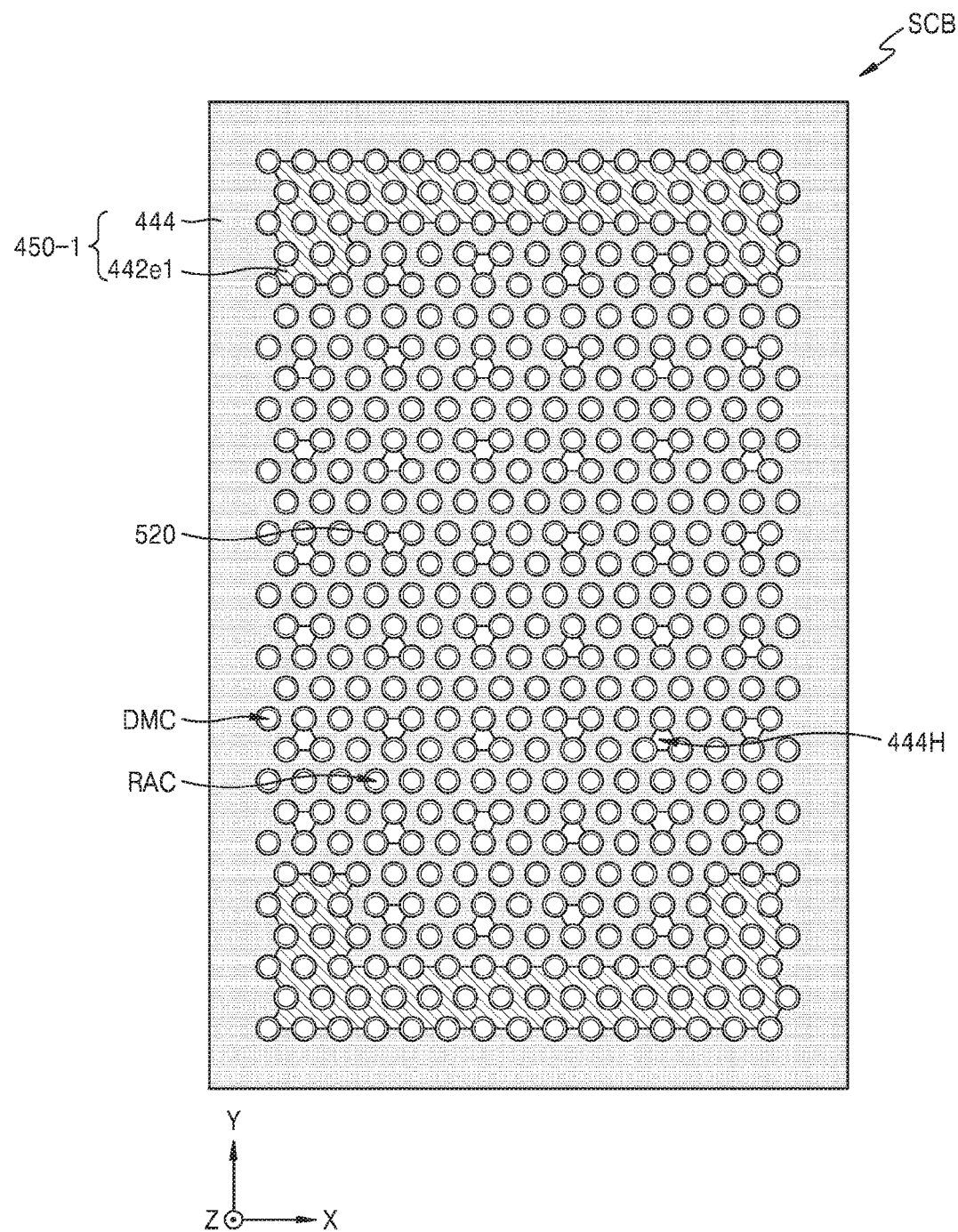
Figure 6C:
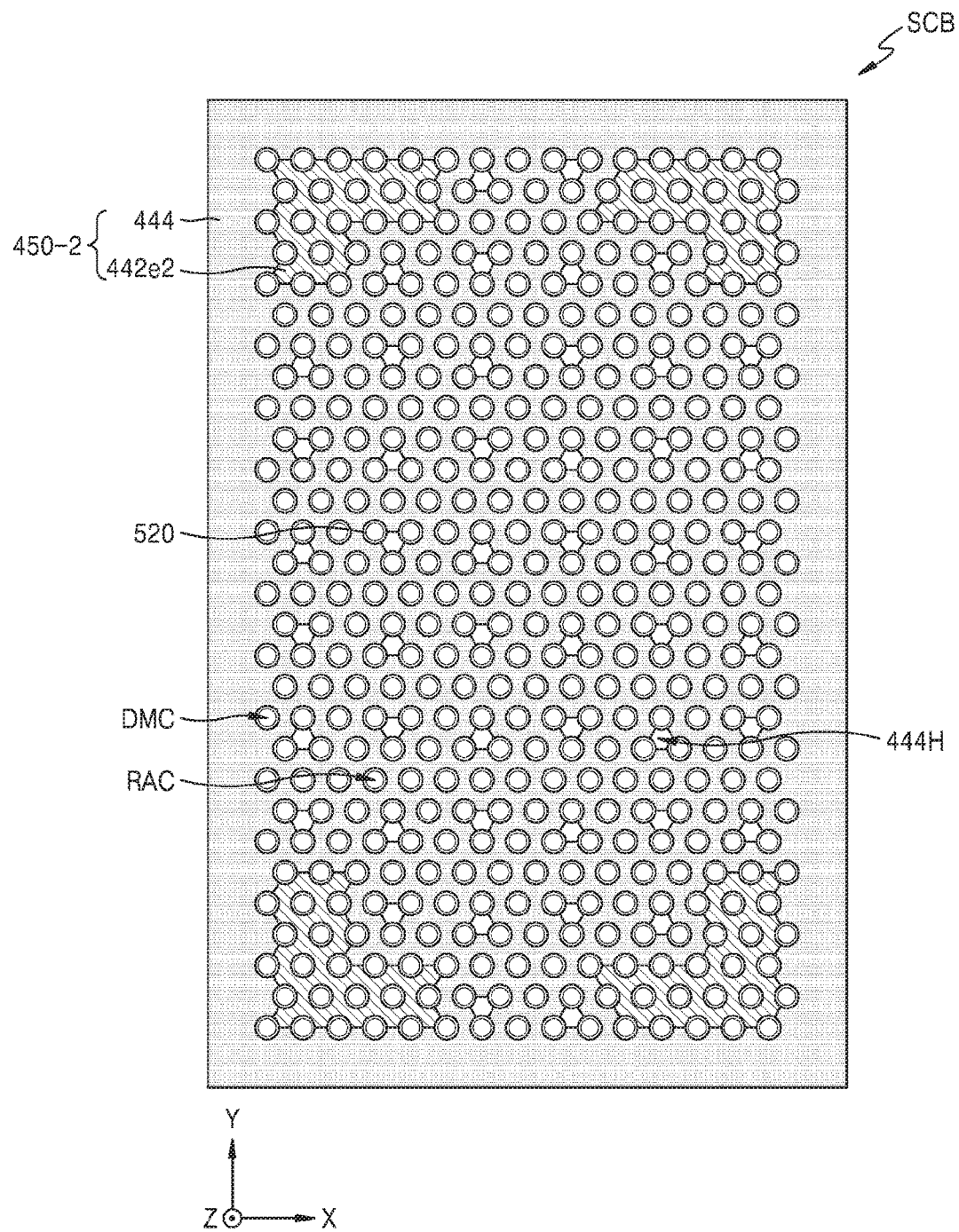

FIGS. 6A to 6C are plan views illustrating an arrangement structure of capacitors and a support pattern included in a semiconductor device according to an embodiment. FIGS. 6A to 6C may be plan views seen from a bottom side of an upper support pattern. Thus, a bottom surface of each of, or at least one of a first upper pattern and a second upper pattern included in the upper support pattern may be shown in FIGS. 6A to 6C.

Referring to FIG. 6A, a plurality of capacitors RAC and DMC including first electrodes 520 may be arranged in the cell block SCB. Among the plurality of capacitors RAC and DMC, a plurality of functional capacitors RAC may be arranged in the inner region of the cell block SCB, and a plurality of dummy capacitors DMC may be arranged in the outer region of the cell block SCB to surround the plurality of functional capacitors RAC.

The upper support pattern 450 may include the first upper pattern 444 and the second upper pattern 442e. The first upper pattern 444 may simultaneously or concurrently support the plurality of functional capacitors RAC and the plurality of dummy capacitors DMC in the cell block SCB. The second upper pattern 442e may support, for example may mechanically support, all or some of the plurality of dummy capacitors DMC.

The first upper pattern 444 may have the first upper opening 444H penetrating the first upper pattern 444. The first upper pattern 444 may protrude outwards from the outermost first electrodes 520 among the plurality of first electrodes 520. In some example embodiments, the first upper opening 444H may be arranged between portions of respective sidewalls of some of the first electrodes 520 of the plurality of functional capacitors RAC.

As will be described below with reference to FIGS. 17 to 22, a preliminary second upper pattern (442P1 of FIG. 21) may be formed such that the planar shape of the first upper pattern 444 is transferred to the preliminary second upper pattern 442P1, followed by removing portions of the preliminary second upper pattern 442P1, which are adjacent to the edge of the first upper pattern 444 and the first upper opening 444H, thereby forming the second upper pattern 442e. Thus, the second upper pattern 442e may overlap the first upper pattern 444, and may have a smaller planar area than the first upper pattern 444. The second upper pattern 442e may be separated from the edge of the first upper pattern 444 and from the first upper opening 444H to overlap and contact the inner portion of the bottom surface of the first upper pattern 444.

In some example embodiments, the second upper pattern 442e may support all or at least some of the dummy capacitors DMC, without supporting the functional capacitors RAC. For example, in some example embodiments, the second upper pattern 442e may not contact the first electrodes 520 of the functional capacitors RAC.

The second upper pattern 442e may have a ring shape, which is adjacent to the edge of the first upper pattern 444 and extends continuously. In some example embodiments, the second upper pattern 442e may continuously surround the first electrodes 520 of the functional capacitors RAC.

Since the lower support pattern (420 of FIG. 5) has the same planar shape as the first upper pattern 444 by transferring the planar shape of the first upper pattern 444 to the lower support pattern 420, the planar shape of the lower support pattern 420 and the planar shape and arrangement of the first lower opening 420H may be the same as or similar to the planar shape of the first upper pattern 444 and the planar shape and arrangement of the first upper opening 444H shown in FIG. 6A.

Referring to FIG. 6B, the plurality of capacitors RAC and DMC including the first electrodes 520 may be arranged in the cell block SCB. Among the plurality of capacitors RAC and DMC, the plurality of functional capacitors RAC may be arranged in the inner region of the cell block SCB, and the plurality of dummy capacitors DMC may be arranged in the outer region of the cell block SCB to surround the plurality of functional capacitors RAC.

An upper support pattern 450-1 may include the first upper pattern 444 and a second upper pattern 442e1. The first upper pattern 444 may simultaneously or concurrently support all of, or at least some of, the plurality of functional capacitors RAC and the plurality of dummy capacitors DMC in the cell block SCB. The second upper pattern 442e1 may support some of the plurality of dummy capacitors DMC.

In some example embodiments, the second upper pattern 442e1 may support some of the dummy capacitors DMC without supporting, or supporting any of, the functional capacitors RAC.

The second upper pattern 442e1 may include a plurality of second upper patterns 442e1, which are adjacent to different corners of the bottom surface of the first upper pattern 444 and separated from one another. For example, the corners of the bottom surface of the first upper pattern 444 may correspond to corners of the upper support pattern 450-1 when viewed from the Z direction. For example, the second upper pattern 442e1 may include two second upper patterns 442e1 separated from one another, the two second upper patterns 442e1 each being adjacent to two corners of the first upper pattern 444, to an edge of the first upper pattern 444, which connects the two corners, and to portions of edges of the first upper pattern 444, which extend from the two corners to the other two corners. In some example embodiments, the two second upper patterns 442e1 may intermittently surround the plurality of functional capacitors RAC.

Therefore, the second upper patterns 442e1 may not be adjacent to middle portions of some of sides included in the edges of the first upper pattern 444.

Although one second upper pattern 442e1 is shown in FIG. 6B as continuously extending along the X axis edge of the first upper pattern 444, inventive concepts are not limited thereto. For example, one second upper pattern 442e1 may continuously extend along the Y axis edge of the first upper pattern 444.

Referring to FIG. 6C, the plurality of capacitors RAC and DMC including the first electrodes 520 may be arranged in the cell block SCB. Among the plurality of capacitors RAC and DMC, the plurality of functional capacitors RAC may be arranged in the inner region of the cell block SCB, and the plurality of dummy capacitors DMC may be arranged in the outer region of the cell block SCB to surround the plurality of functional capacitors RAC.

An upper support pattern 450-2 may include the first upper pattern 444 and a second upper pattern 442e2. The first upper pattern 444 may simultaneously or concurrently support all of, or at least some of, the plurality of functional capacitors RAC and the plurality of dummy capacitors DMC in the cell block SCB. The second upper pattern 442e2 may support some of the plurality of dummy capacitors DMC.

In some example embodiments, the second upper pattern 442e2 may support some of the dummy capacitors DMC without supporting the functional capacitors RAC.

The second upper pattern 442e2 may include a plurality of second upper patterns 442e2, which are adjacent to different corners of the bottom surface of the first upper pattern 444 and separated from one another. For example, the second upper pattern 442e2 may include four second upper patterns 442e2 separated from one another, the four second upper patterns 442e2 each being adjacent to one corner of the first upper pattern 444 and to portions of edges of the first upper pattern 444, which are connected to the one corner. In some example embodiments, the four second upper patterns 442e2 may intermittently surround the plurality of functional capacitors RAC.

Therefore, the second upper patterns 442e2 may not be adjacent to the middle portions of the sides included in the edges of the first upper pattern 444.

Each of, or at least one of the second upper patterns 442e, 442e1, and 442e2 shown in FIGS. 6A to 6C is arranged in the outer region of the cell block SCB, and thus may be referred to as an upper outer pattern.

Figure 7:
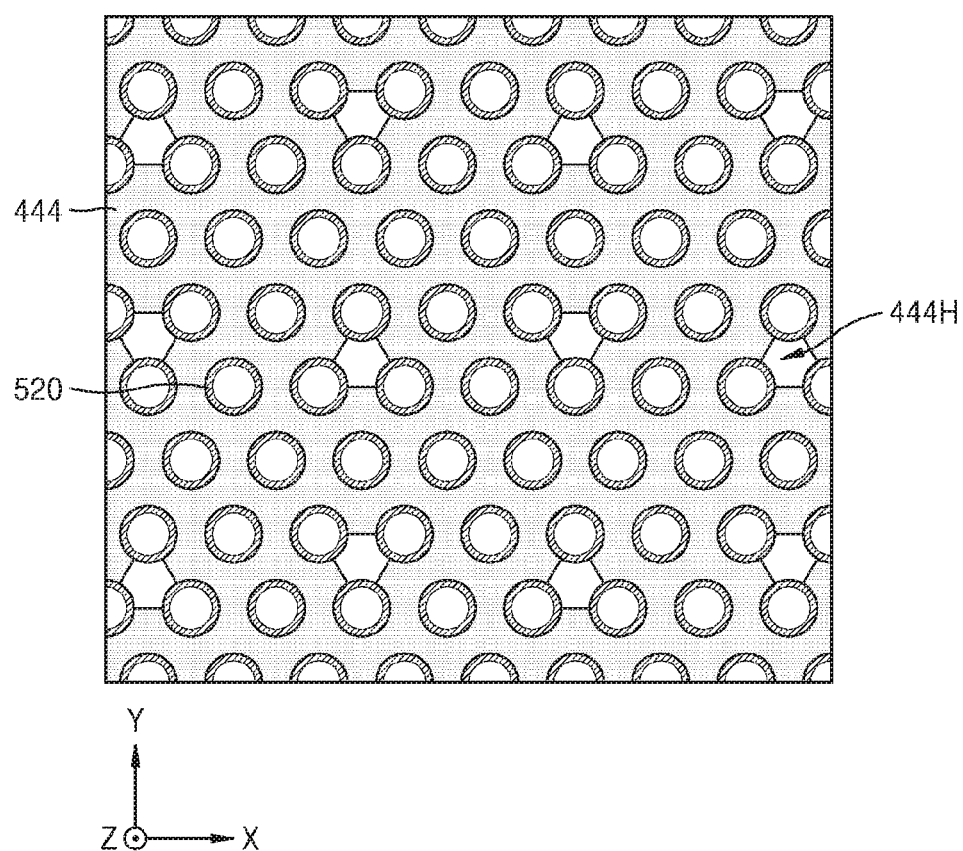
FIG. 7 is a plan view illustrating an example of a support pattern included in a semiconductor device according to an example embodiment.

FIG. 7 is a plan view illustrating an example of a support pattern included in a semiconductor device according to an embodiment.

Referring to FIG. 7, the first upper pattern 444 out of the support patterns may contact the sidewalls of the plurality of first electrodes 520. The first upper pattern 444 may have a plurality of first upper openings 444H penetrating the first upper pattern 444. In some example embodiments, each first upper opening 444H may have an approximately triangular planar shape. Here, the approximately triangular planar shape means that each first upper opening 444H has a triangular planar shape when assumed to extend up to insides of the first electrodes 520. Each first upper opening 444H may contact portions of respective sidewalls of some of the plurality of first electrodes 520. For example, each first upper opening 444H may contact portions of respective sidewalls of three or more first electrodes 520. Accordingly, the first upper pattern 444 may contact at least portions of the sidewalls of all of, or at least most of, the plurality of first electrodes 520.

In some example embodiments, one first electrode 520 contacting one first upper opening 444H may not contact other first upper openings 444H.

The lower support pattern (420 of FIG. 5) may have the same planar shape as the first upper pattern 444 by transferring the planar shape of the first upper pattern 444 to the lower support pattern 420.

Figure 8A:
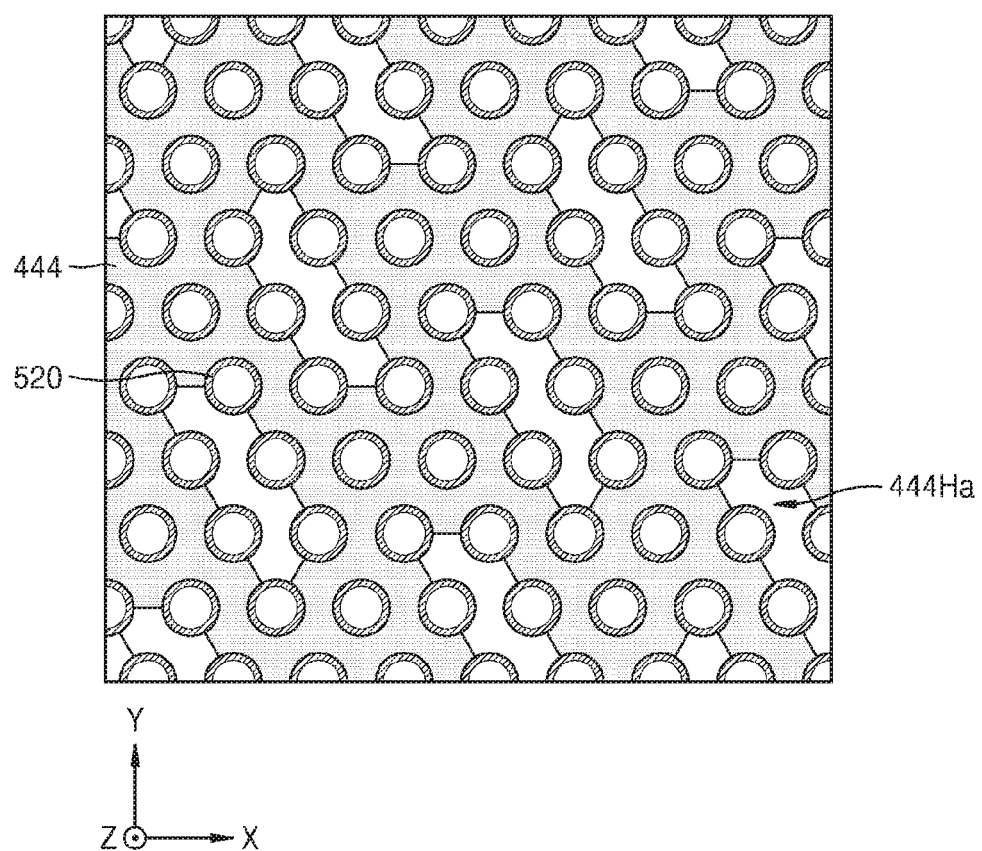
FIGS. 8A to 8N are plan views illustrating examples of a support pattern included in a semiconductor device according to an example embodiment.
Figure 8B:
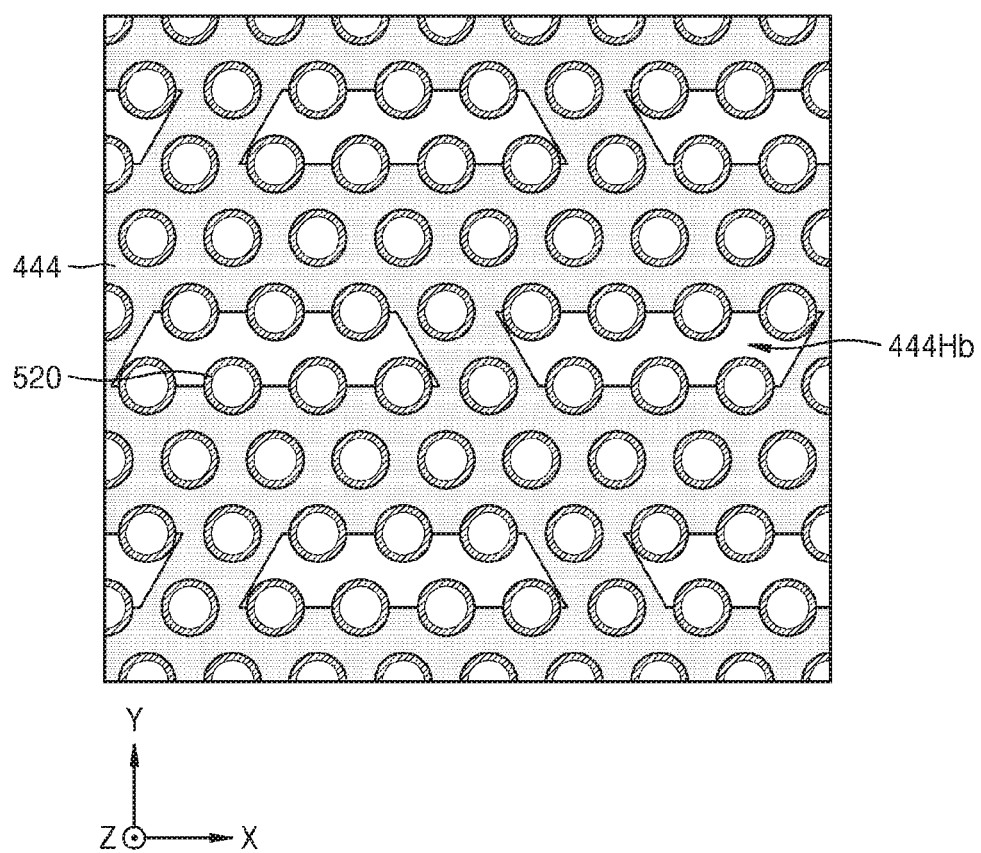
Figure 8C:
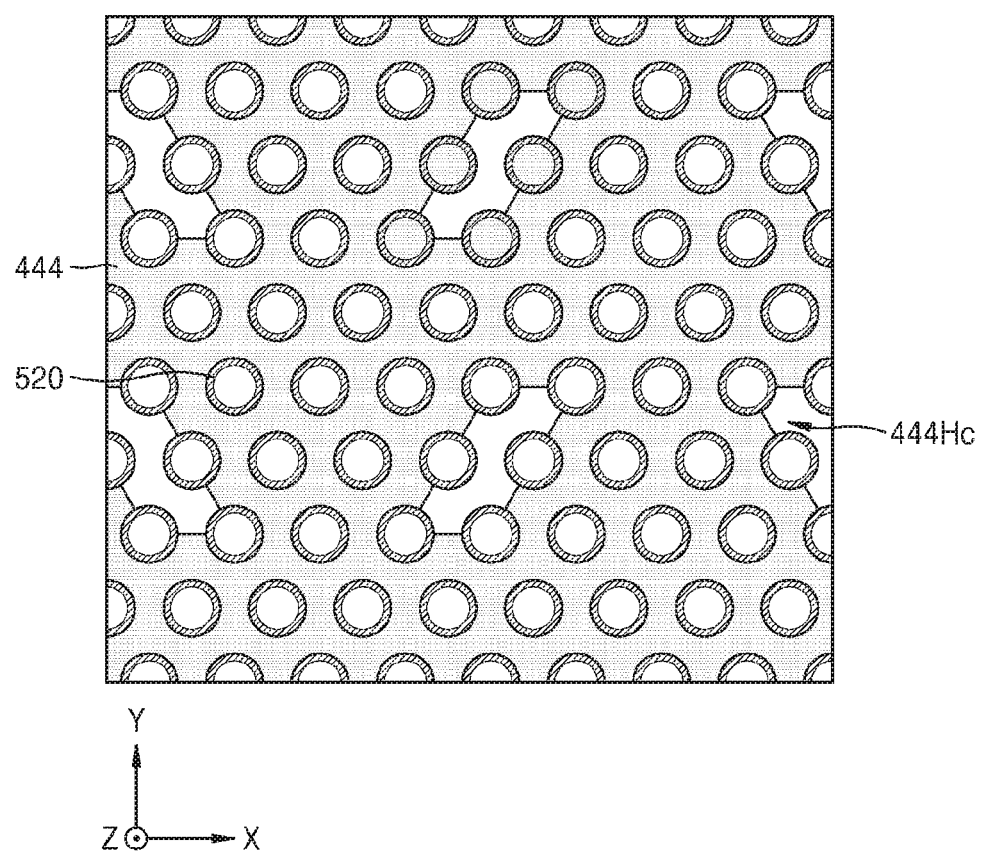
Figure 8D:
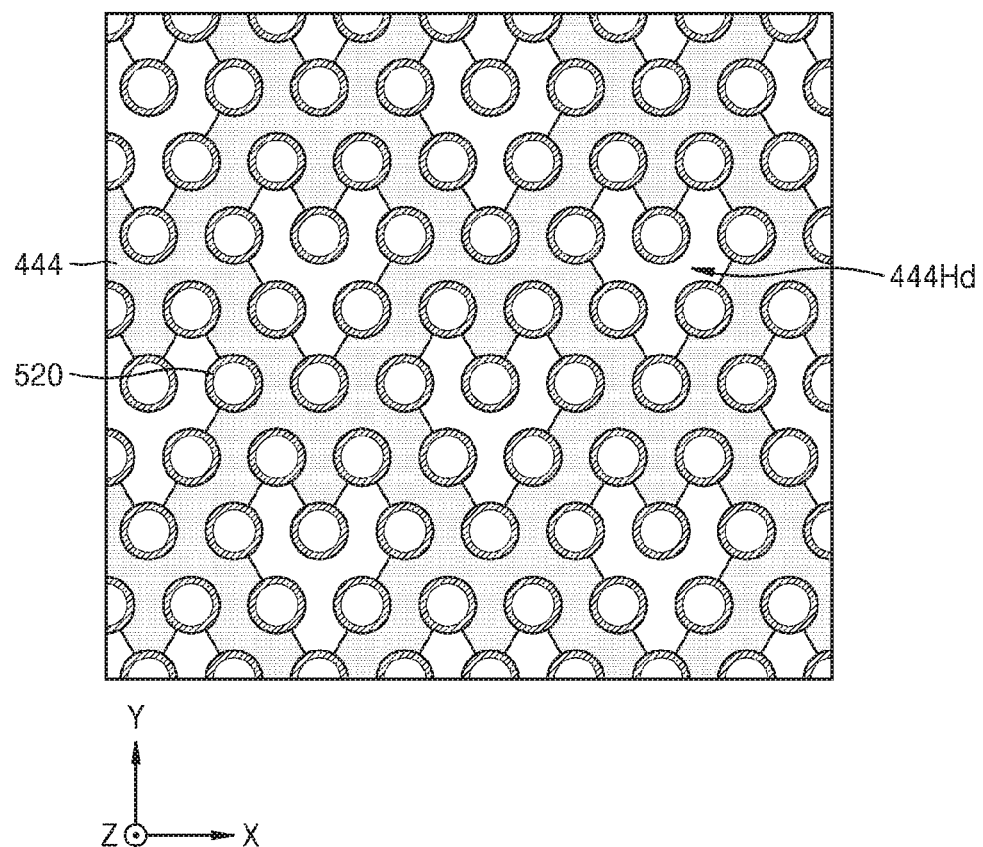
Figure 8E:
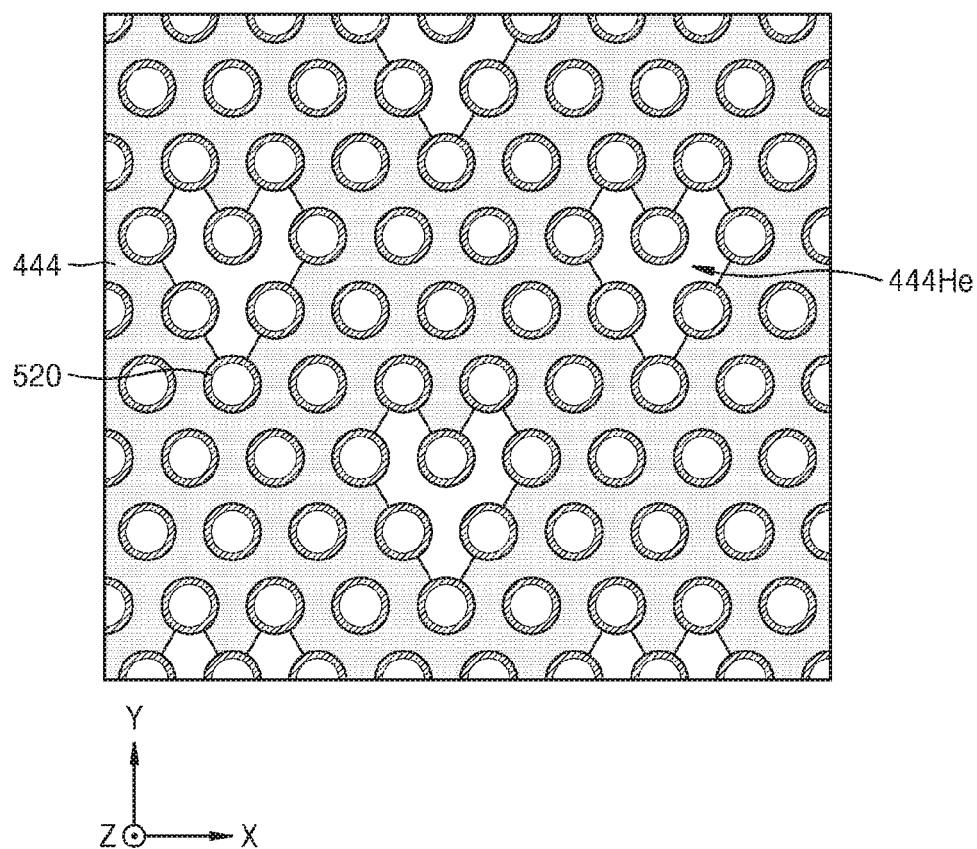
Figure 8F:
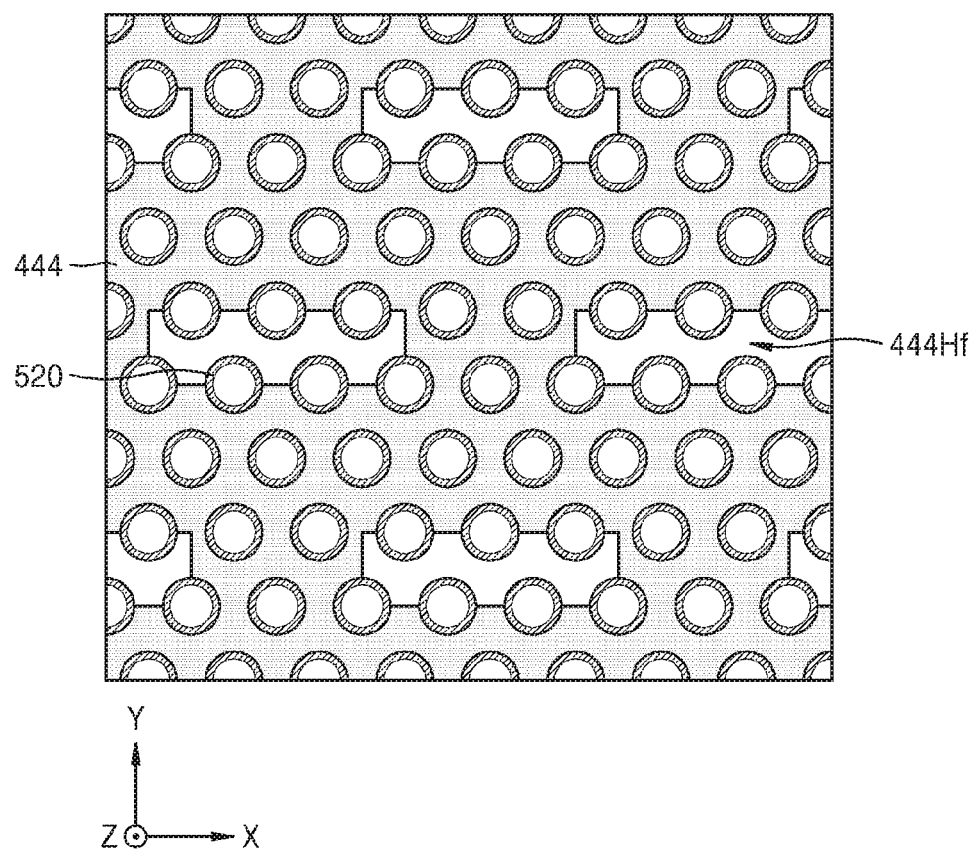
Figure 8G:
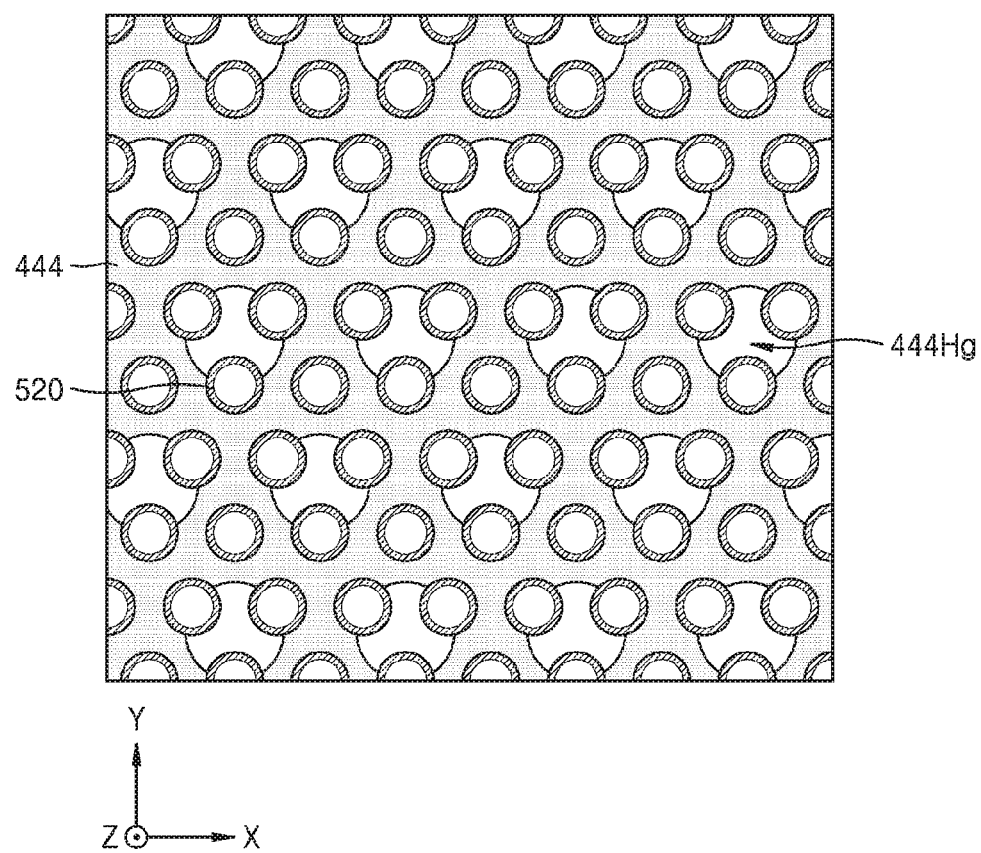
Figure 8H:
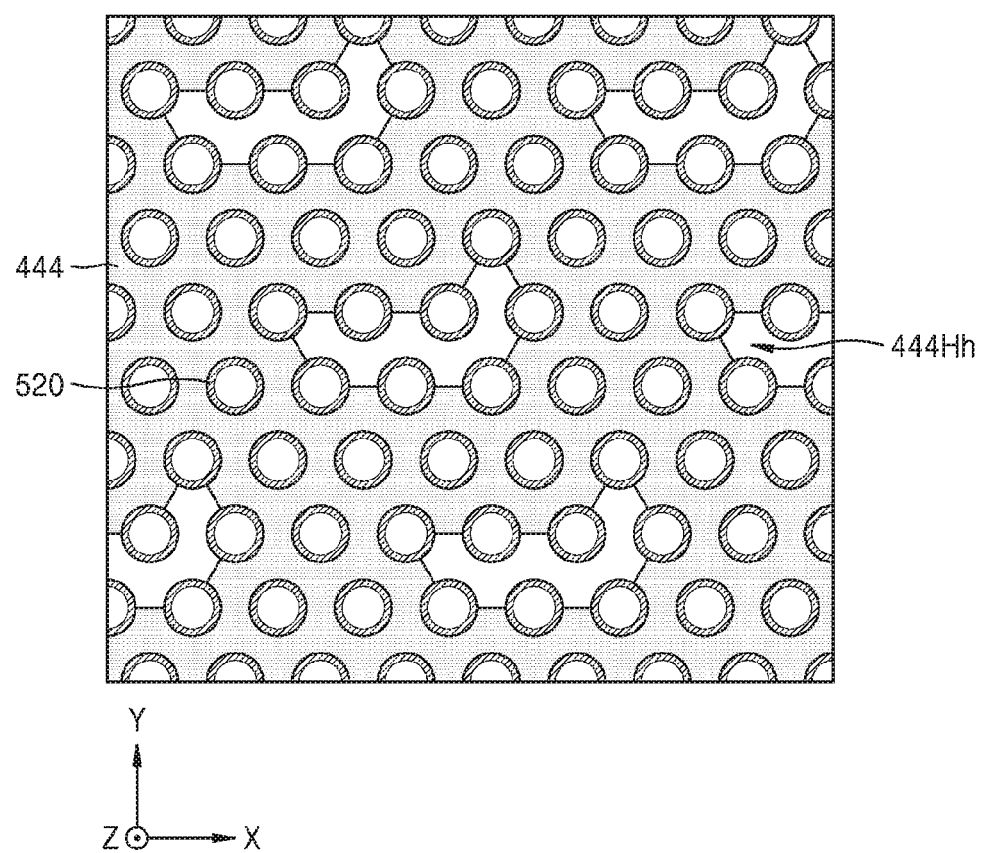
Figure 8I:
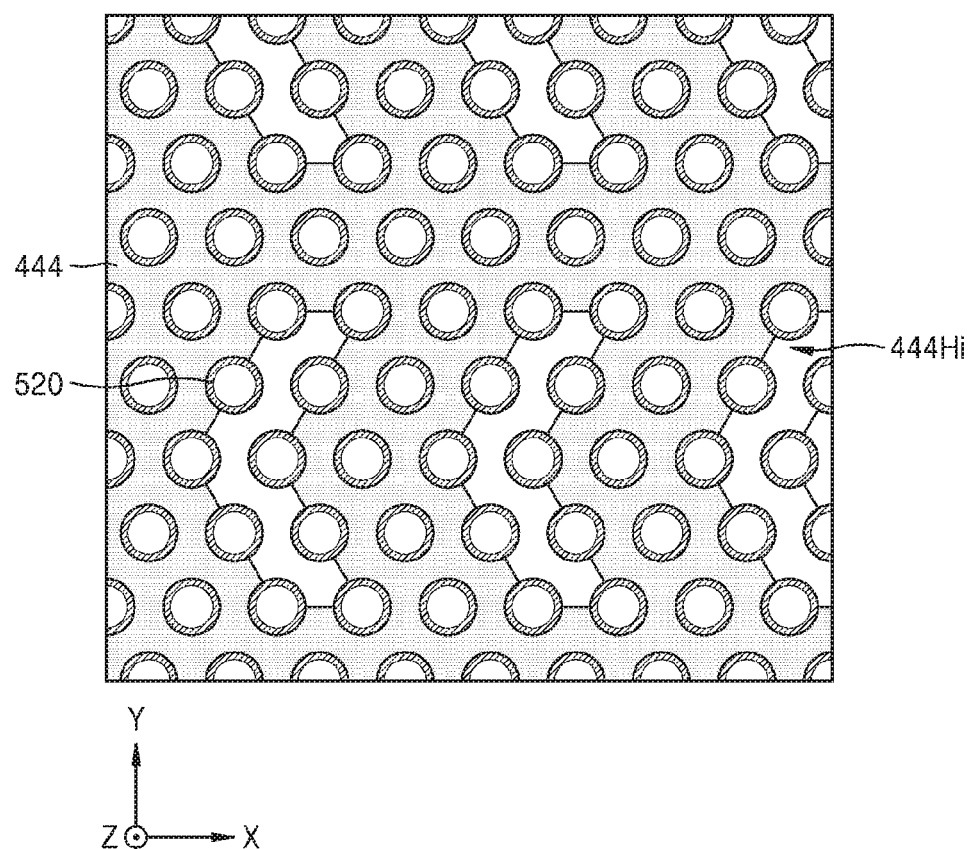
Figure 8J:
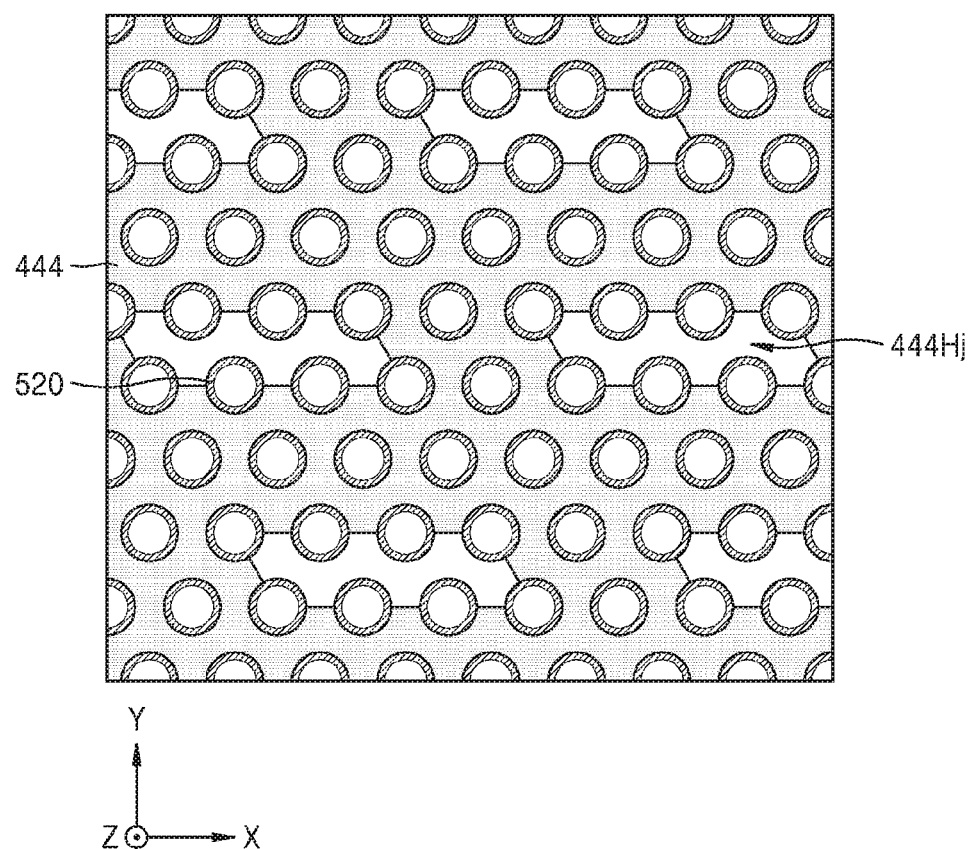
Figure 8K:
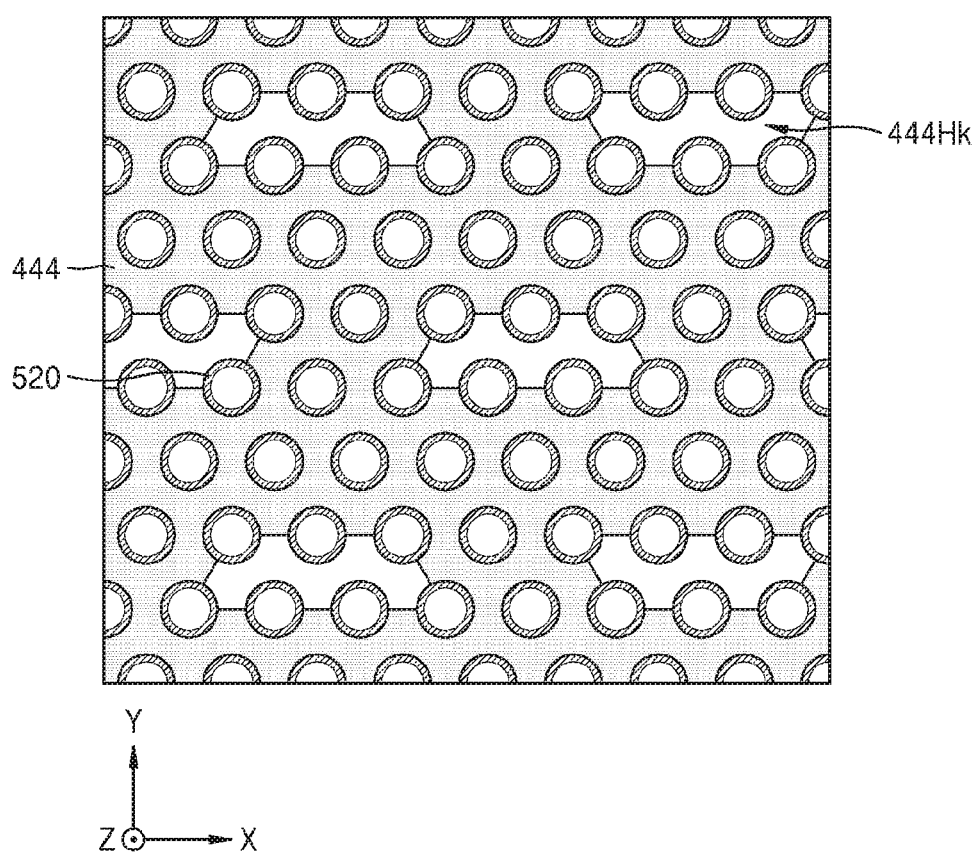
Figure 8L:
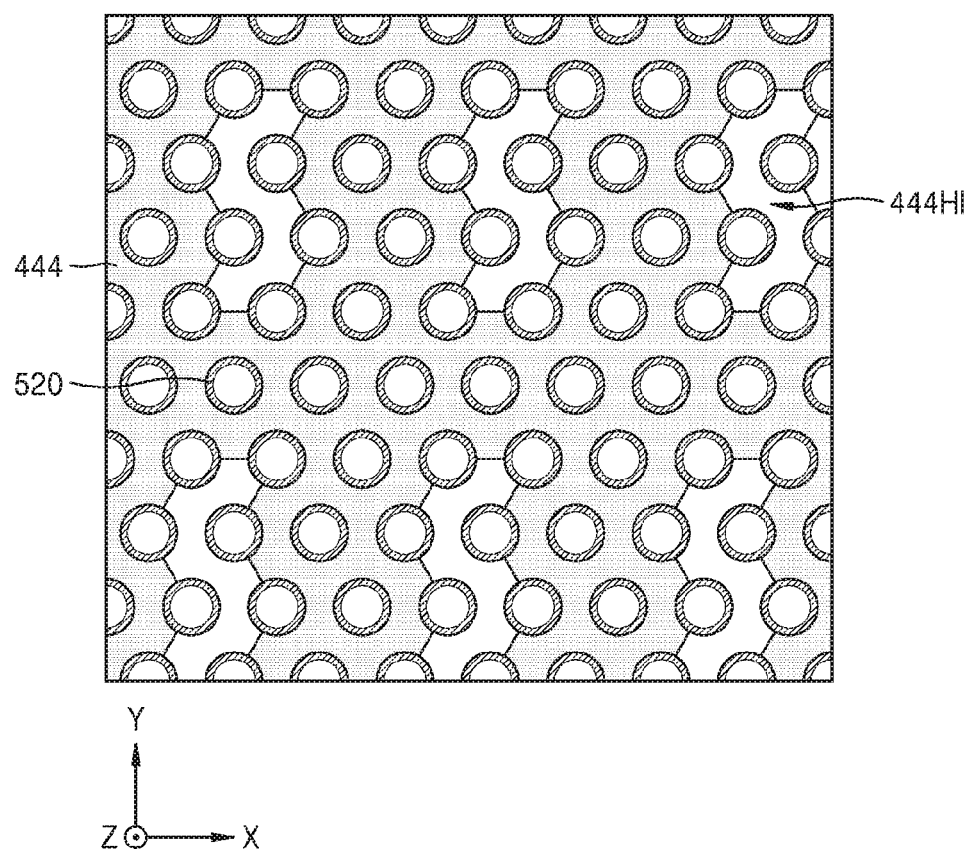
Figure 8M:
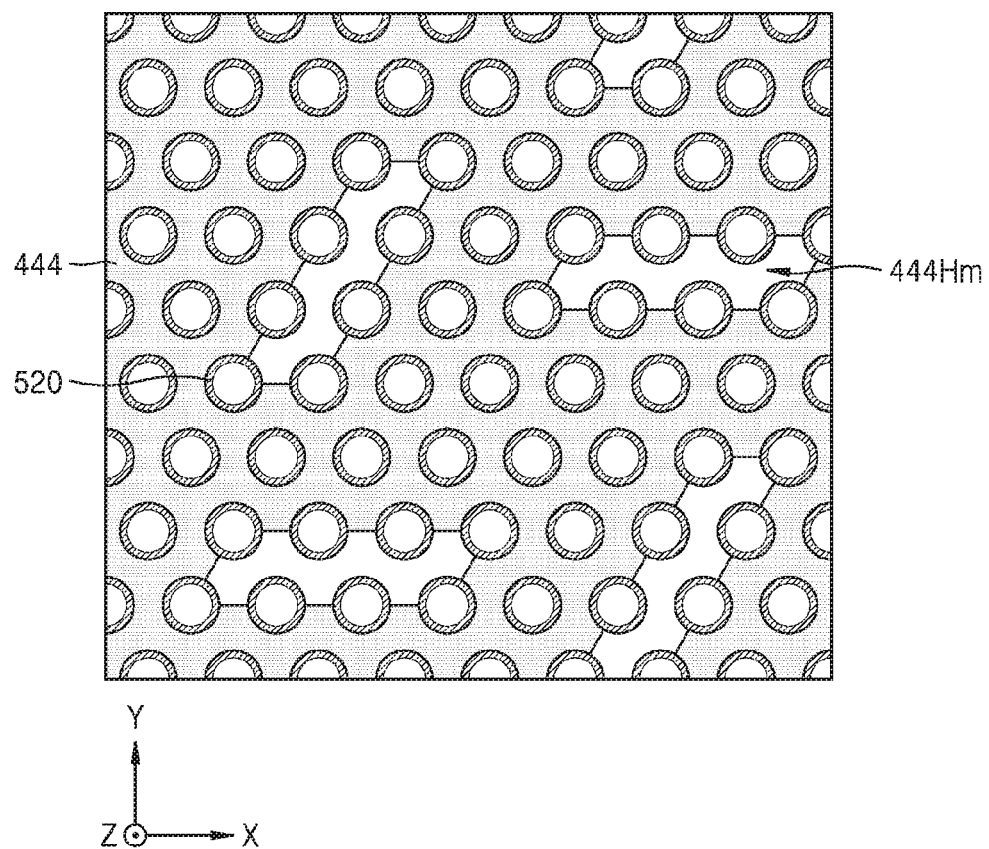
Figure 8N:
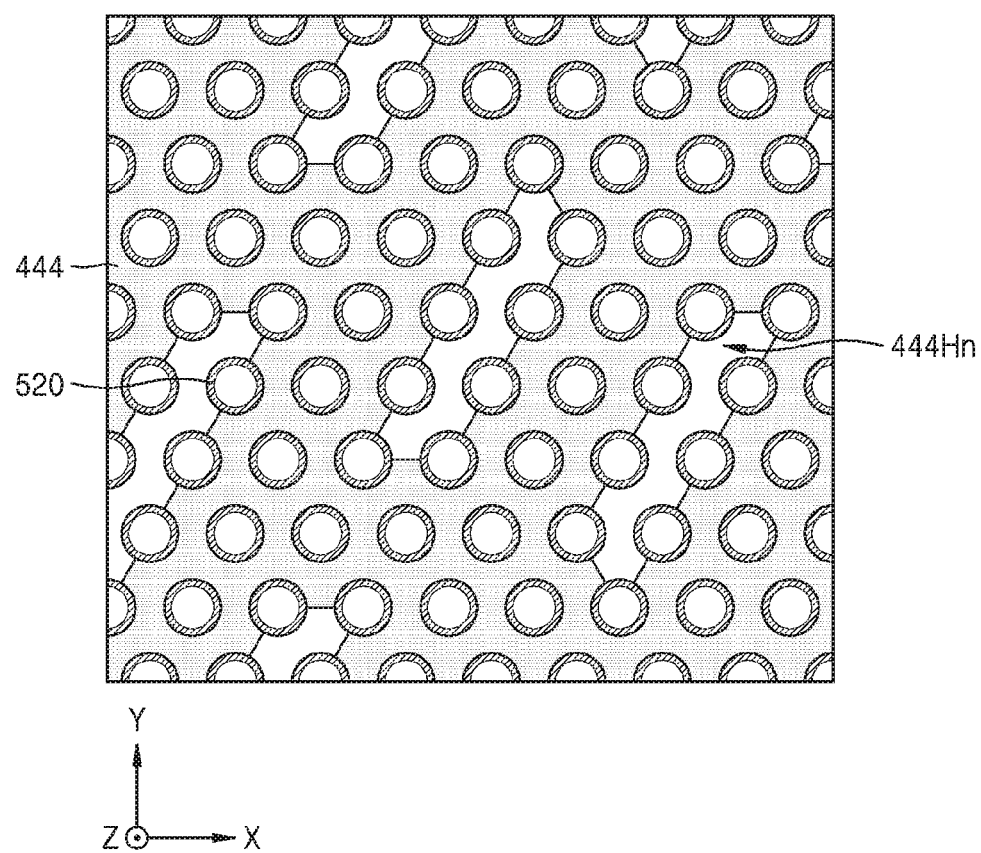

FIGS. 8A to 8N are plan views illustrating examples of a support pattern included in a semiconductor device according to example embodiments.

Referring to FIGS. 7 and 8A, 8B, 8C, 8D, 8E, 8F, 8G, 8H, 8I, 8J, 8K, 8L, 8M and 8N, the first upper pattern 444 out of the support patterns may have a plurality of first upper openings 444Ha, 444Hb, 444Hc, 444Hd, 444He, 444Hf, 444Hg, 444Hh, 444Hi, 444Hj, 444Hk, 444Hl, 444Hm and 444Hn penetrating the first upper pattern 444.

Planar shapes of the first upper openings 444H and 444Ha to 444Hn shown in FIGS. 7 and 8A to 8N are merely examples, and inventive concepts are not limited thereto.

For example, the first upper pattern 444 may have the plurality of first upper openings 444H and 444Ha to 444Hn having planar shapes such as approximate circles, approximate triangles, approximate rectangles, approximate trapezoids, approximate parallelograms, approximate heart shapes, approximate clamp shapes, or approximate lightening shapes, and the manner, direction, angle, and interval of the arrangement thereof, the planar area thereof, and the like may be variously changed as shown FIGS. 7 and 8A to 8N or otherwise.

Figure 9:
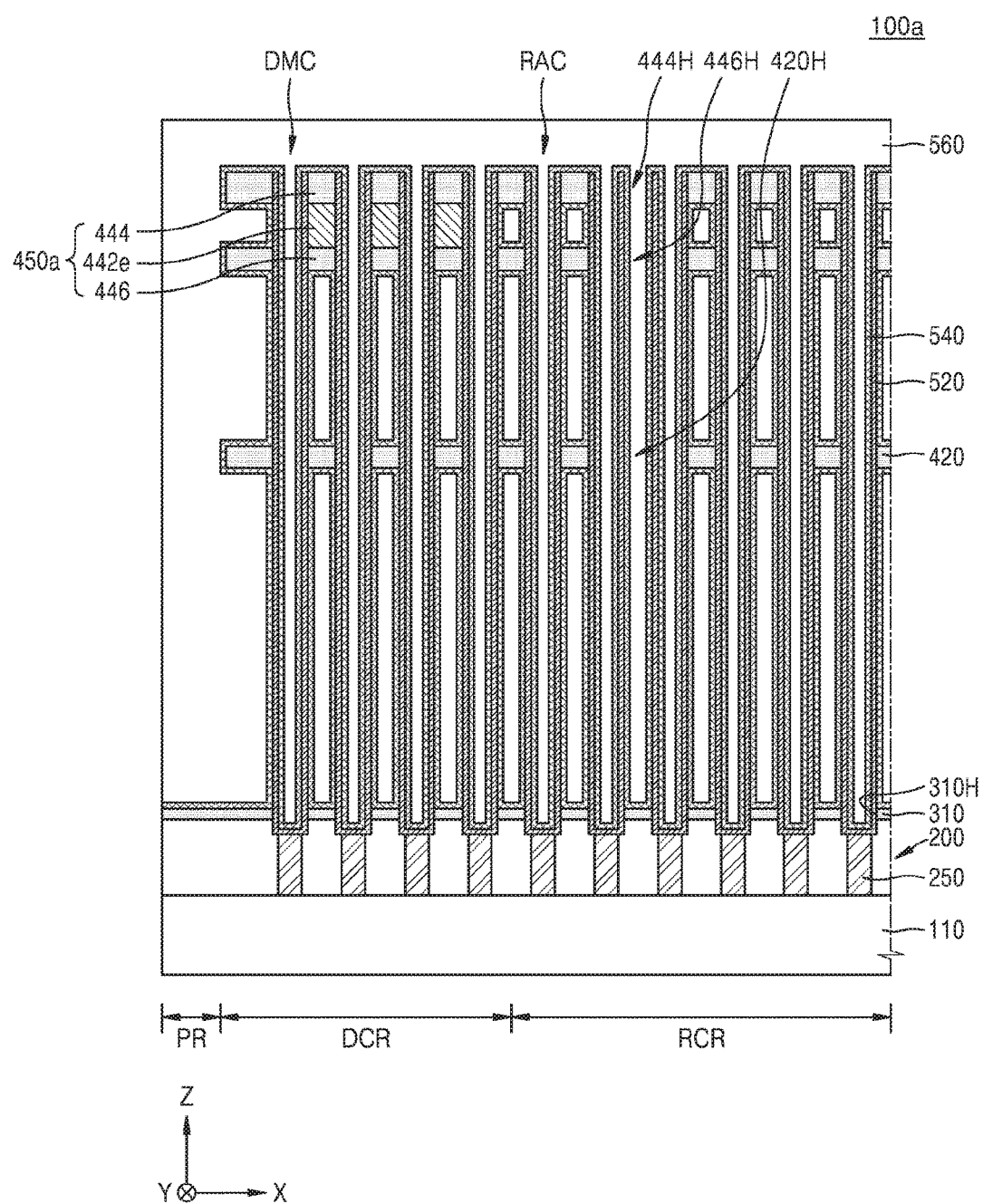
FIGS. 9 and 10 are cross-sectional views illustrating main components of semiconductor devices according to example embodiments.

FIG. 9 is a cross-sectional view illustrating main components of a semiconductor device according to an example embodiment. Repeated descriptions with reference to FIG. 5 may be omitted for clarity and brevity.

Referring to FIG. 9, a semiconductor device 100a may include the lower structure 200 on the substrate 110, and the plurality of contact plugs 250 connected to the substrate 110 through the lower structure 200.

Support patterns 450a and 420 may contact the sidewalls of the plurality of first electrodes 520. The support patterns 450a and 420 may include an upper support pattern 450a and the lower support pattern 420. The upper support pattern 450a and the lower support pattern 420 may be separated from one another.

The upper support pattern 450a may contact the sidewalls of the upper ends of the plurality of first electrodes 520. The lower support pattern 420 may contact the sidewalls under the upper ends of the plurality of first electrodes 520. In some example embodiments, the lower support pattern 420 may be omitted.

The upper support pattern 450a may include the first upper pattern 444, the second upper pattern 442e, and a third upper pattern 446. The first upper pattern 444 and the second upper pattern 442e may include different materials from each other. The third upper pattern 446 and the second upper pattern 442e may include different materials from each other. In some example embodiments, the first upper pattern 444 and the third upper pattern 446 may include the same material.

The first upper pattern 444 may have a plate-like structure connected, or contiguously connected, as a whole in the cell block (SCB of FIGS. 1 and 2). The first upper pattern 444 may have a first upper opening 444H, which extends from the top surface to the bottom surface of the first upper pattern 444 and penetrates the first upper pattern 444.

The second upper pattern 442e may contact the first upper pattern 444. For example, the top surface of the second upper pattern 442e may contact the bottom surface of the first upper pattern 444. The second upper pattern 442e may be separated from the edge of the bottom surface of the first upper pattern 444 and from the first upper opening 444H, and may contact the inner portion of the bottom surface of the first upper pattern 444.

The third upper pattern 446 may have the same planar shape as the first upper pattern 444 by transferring the planar shape of the first upper pattern 444 to the third upper pattern 446. The third upper pattern 446 may have a plate-like structure connected, or contiguously connected, as a whole, in the cell block (SCB of FIGS. 1 and 2). The third upper pattern 446 may contact the sidewalls of all of the first electrodes 520 in the functional capacitor region RCR and the dummy capacitor region DCR. For example, the third upper pattern 446 may simultaneously support the plurality of functional capacitors RAC and the plurality of dummy capacitors DMC. The third upper pattern 446 may have a second upper opening 446H, which extends from a top surface to a bottom surface of the third upper pattern 446 and penetrates the third upper pattern 446.

The third upper pattern 446 may contact the second upper pattern 442e. For example, the top surface of the third upper pattern 446 may contact a bottom surface of the second upper pattern 442e. The second upper pattern 442e may be separated from the edge of the top surface of the third upper pattern 446 and from the second upper opening 446H, and the bottom surface of the second upper pattern 442e may contact an inner portion of the top surface of the third upper pattern 446.

For example, the upper support pattern 450a may have a sandwich structure, in which the second upper pattern 442e is between the first upper pattern 444 and the third upper pattern 446.

The planar area of the second upper pattern 442e may be less than the planar area of each of, or at least one of the first upper pattern 444 and the third upper pattern 446. For example, the area of each of, or at least one of the top surface and the bottom surface of the second upper pattern 442e may be less than the area of each of, or at least one of the bottom surface of the first upper pattern 444 and the top surface of the third upper pattern 446.

Figure 10:
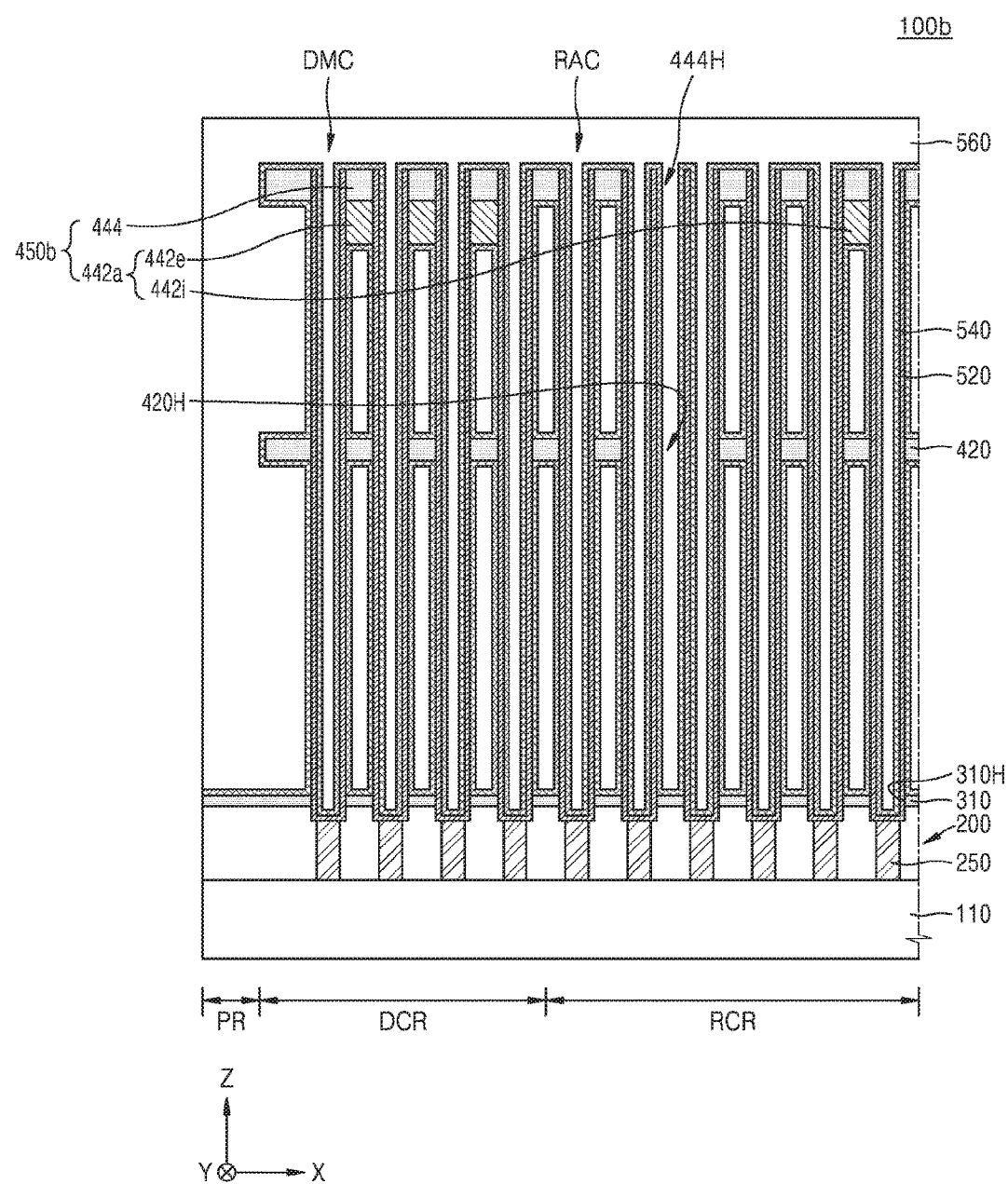

FIG. 10 is a cross-sectional view illustrating main components of a semiconductor device according to an embodiment. Repeated descriptions with reference to FIGS. 5 and 9 may be omitted.

Referring to FIG. 10, a semiconductor device 100b may include the lower structure 200 on the substrate 110, and the plurality of contact plugs 250 connected to the substrate 110 through the lower structure 200.

Support patterns 450b and 420 may contact the sidewalls of the plurality of first electrodes 520. The support patterns 450b and 420 may include an upper support pattern 450b and the lower support pattern 420. The upper support pattern 450b and the lower support pattern 420 may be separated from one another.

The upper support pattern 450b may contact the sidewalls of the upper ends of the plurality of first electrodes 520. The lower support pattern 420 may contact the sidewalls under the upper ends of the plurality of first electrodes 520.

In some example embodiments, the lower support pattern 420 may be omitted.

The upper support pattern 450b may include the first upper pattern 444 and a second upper pattern 442a. The first upper pattern 444 and the second upper pattern 442a may include different materials from each other.

The second upper pattern 442a may contact the first upper pattern 444. For example, a top surface of the second upper pattern 442a may contact the bottom surface of the first upper pattern 444. The second upper pattern 442a may be separated from the edge of the bottom surface of the first upper pattern 444 and from the first upper opening 444H, and may contact the inner portion of the bottom surface of the first upper pattern 444.

The second upper pattern 442a may include an upper outer pattern 442e and an upper inner pattern 442i. Since the upper outer pattern 442e is substantially the same as the second upper pattern 442e described with reference to FIG. 5, descriptions thereof will be omitted. For example, the second upper pattern 442a of the semiconductor device 100b shown in FIG. 10 may further include the upper inner pattern 442i, unlike the second upper pattern 442e of the semiconductor device 100 shown in FIG. 5.

The upper inner pattern 442i may have an island shape separated from the upper outer pattern 442e. The upper inner pattern 442i may be separated from the first upper opening 444H and contact the bottom surface of the first upper pattern 444.

The thickness of the upper outer pattern 442e may be substantially equal to the thickness of the upper inner pattern 442i. The upper inner pattern 442i may contact the sidewalls of the first electrodes 520 of some of the plurality of functional capacitors RAC and support some of the plurality of functional capacitors RAC. For example, all of the plurality of functional capacitors RAC may be supported by the first upper pattern 444, and some of the plurality of functional capacitors RAC may be simultaneously supported by the first upper pattern 444 and the upper inner pattern 442i.

The planar area of the second upper pattern 442a, for example, a sum of the planar area of the upper outer pattern 442e and the planar area of the upper inner pattern 442i may be less than the planar area of the first upper pattern 444. For example, the area of the top surface of the second upper pattern 442a may be less than the area of the bottom surface of the first upper pattern 444.

Figure 11:
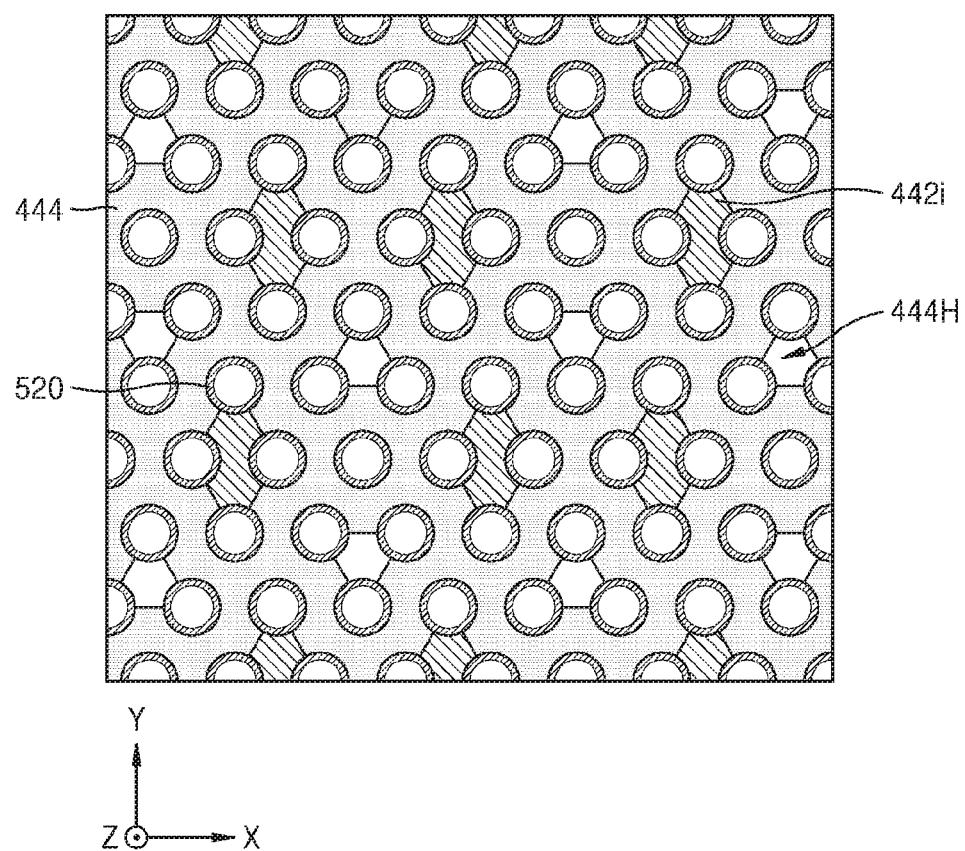
FIG. 11 is a plan view illustrating an example of a support pattern included in a semiconductor device according to an example embodiment.

FIG. 11 is a plan view illustrating an example of a support pattern included in a semiconductor device according to an embodiment. Repeated descriptions with reference to FIGS. 7, 9, and 10 will be omitted for clarity and brevity.

Referring to FIG. 11, the first upper pattern 444 of the support patterns may contact the sidewalls of the plurality of first electrodes 520. The first upper pattern 444 may have the plurality of first upper openings 444H penetrating the first upper pattern 444. In some example embodiments, each first upper opening 444H may have a triangular planar shape, although inventive concepts are not limited thereto. Since the planar shapes of the first upper openings 444H have been described with reference to FIGS. 7 and 8A to 8N, descriptions thereof will be omitted.

Each first upper opening 444H may contact portions of the sidewalls of some of the plurality of first electrodes 520. For example, each first upper opening 444H may contact portions of respective sidewalls of three or more first electrodes 520. The upper inner pattern 442i may be separated from the first upper openings 444H and contact the bottom surface of the first upper pattern 444. The upper inner pattern 442i may contact portions of the respective sidewalls of the plurality of first electrodes 520.

A plurality of upper inner patterns 442i may have island shapes separated from one another.

Figure 12:
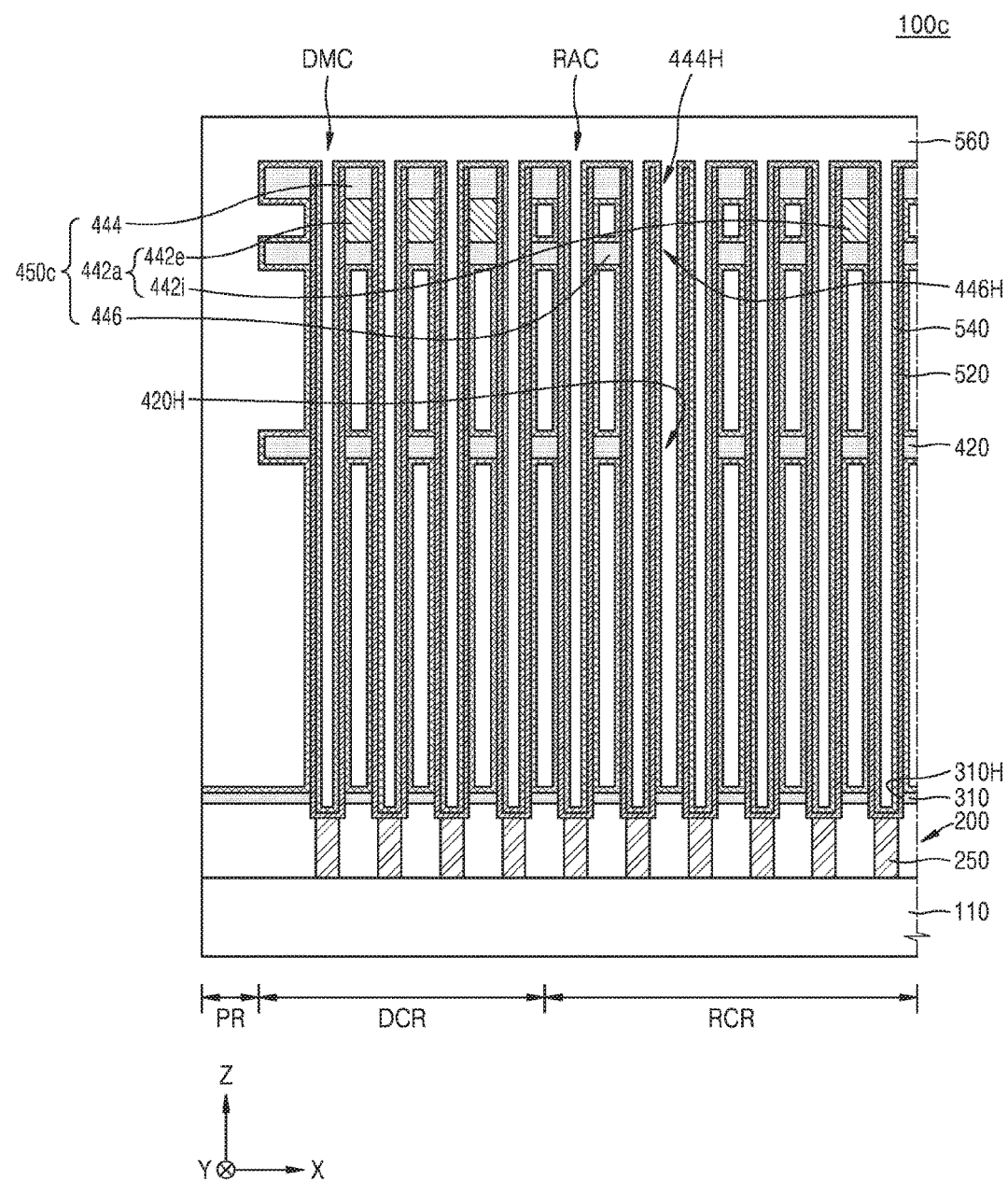
FIGS. 12 to 16 are cross-sectional views illustrating main components of semiconductor devices according to example embodiments.

FIG. 12 is a cross-sectional view illustrating main components of a semiconductor device according to an embodiment. Repeated descriptions with reference to FIGS. 5, 9 and 10 will be omitted for clarity and brevity.

Referring to FIG. 12, a semiconductor device 100c may include the lower structure 200 on the substrate 110, and the plurality of contact plugs 250 connected to the substrate 110 through the lower structure 200.

Support patterns 450c and 420 may contact the sidewalls of the plurality of first electrodes 520. The support patterns 450c and 420 may include an upper support pattern 450c and the lower support pattern 420. The upper support pattern 450c and the lower support pattern 420 may be separated from one another.

The upper support pattern 450c may contact the sidewalls of the upper ends of the plurality of first electrodes 520. The lower support pattern 420 may contact the sidewalls under the upper ends of the plurality of first electrodes 520. In some example embodiments, the lower support pattern 420 may be omitted.

The upper support pattern 450c may include the first upper pattern 444, the second upper pattern 442a, and the third upper pattern 446. The first upper pattern 444 and the second upper pattern 442a may include different materials from each other. The third upper pattern 446 and the second upper pattern 442a may include different materials from each other. However, inventive concepts are not limited thereto, and the third upper pattern 446 and the second upper pattern 442a may include the same materials.

The second upper pattern 442a may contact the first upper pattern 444. For example, the top surface of the second upper pattern 442a may contact the bottom surface of the first upper pattern 444. The second upper pattern 442a may be separated from the edge of the bottom surface of the first upper pattern 444 and from the first upper opening 444H, and may contact the inner portion of the bottom surface of the first upper pattern 444.

The second upper pattern 442a may include the upper outer pattern 442e and the upper inner pattern 442i. Since the upper outer pattern 442e is substantially the same as the second upper pattern 442e described with reference to FIG. 5 and the upper inner pattern 442i is substantially the same as the upper inner pattern 442i described with reference to FIG. 10, descriptions thereof will be omitted for clarity and brevity.

The upper support pattern 450c may have a sandwich structure, in which the second upper pattern 442a including the upper outer pattern 442e and the upper inner pattern 442i is between the first upper pattern 444 and the third upper pattern 446.

The planar area of the second upper pattern 442a, for example, the sum of the planar area of the upper outer pattern 442e and the planar area of the upper inner pattern 442i may be less than each of the planar area of the first upper pattern 444 and the planar area of third upper pattern 446. For example, the area of each of the top surface and the bottom surface of the second upper pattern 442a may be less than the area of each of the bottom surface of the first upper pattern 444 and the top surface of the third upper pattern 446.

Figure 13:
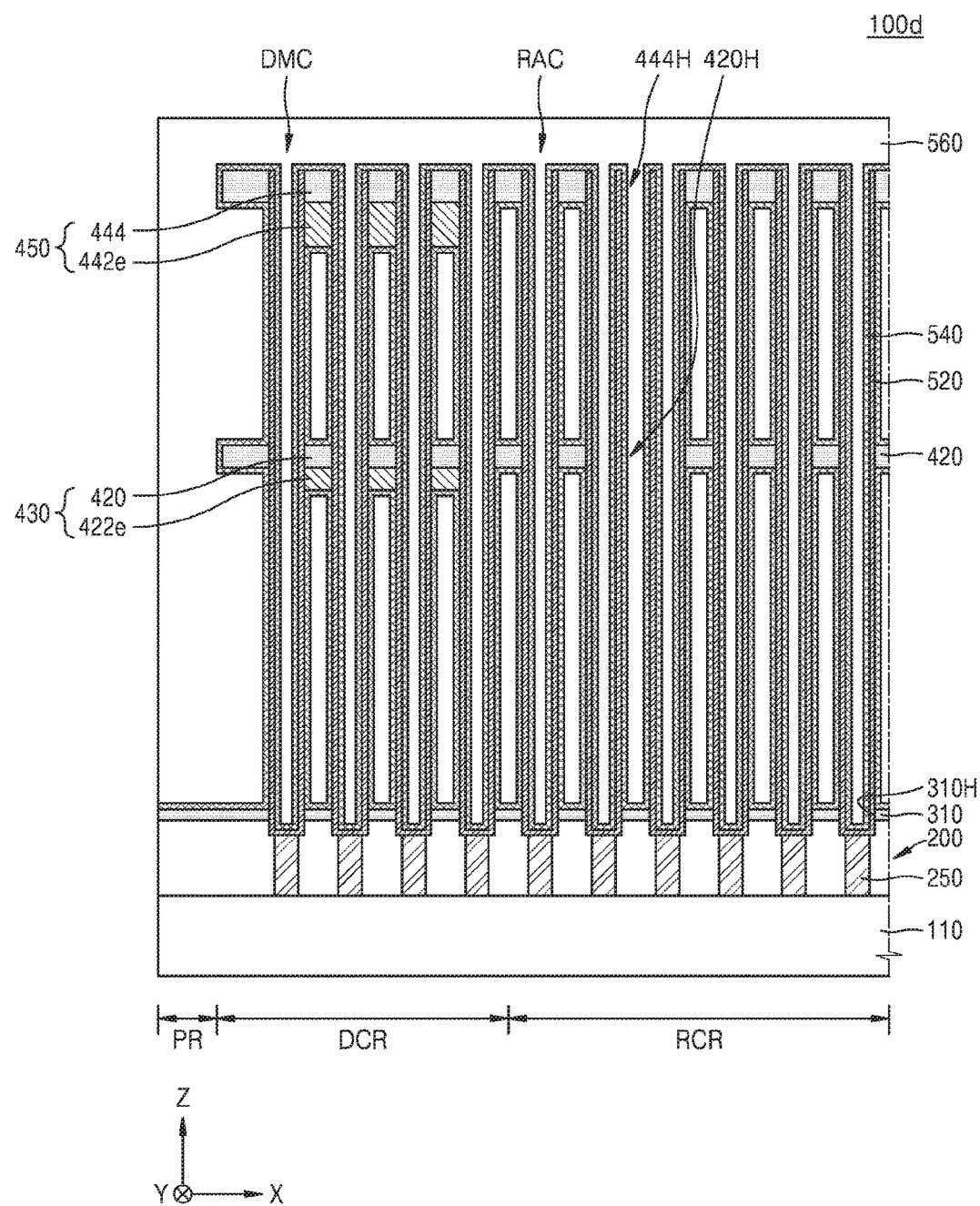

FIG. 13 is a cross-sectional view illustrating main components of a semiconductor device according to an embodiment. Repeated descriptions with reference to FIGS. 5 and 10 will be omitted for clarity and brevity.

Referring to FIG. 13, a semiconductor device 100d may include the lower structure 200 on the substrate 110, and the plurality of contact plugs 250 connected to the substrate 110 through the lower structure 200.

Support patterns 450 and 430a may contact the sidewalls of the plurality of first electrodes 520. The support patterns 450 and 430a may include the upper support pattern 450 and a lower support pattern 430a. The upper support pattern 450 and the lower support pattern 430a may be separated from one another. The upper support pattern 450 may contact the sidewalls of the upper ends of the plurality of first electrodes 520. The lower support pattern 430a may contact the sidewalls under the upper ends of the plurality of first electrodes 520.

Since the upper support pattern 450 is substantially the same as the upper support pattern 450 described with reference to FIG. 5, descriptions thereof will be omitted.

The lower support pattern 430a may include a first lower pattern 420 and a second lower pattern 422e. The first lower pattern 420 and the second lower pattern 422e may include different materials from each other. In some example embodiments, the first lower pattern 420 may include a silicon nitride film or a silicon carbon nitride (SiCN) film. In some example embodiments, the second lower pattern 422e may include an N-rich silicon nitride (N-rich SiN) film or a Si-rich silicon nitride film. Since the first lower pattern 420 is substantially the same as the lower support pattern 420 described with reference to FIG. 5, descriptions thereof will be omitted for clarity and brevity.

The second lower pattern 422e may contact the first lower pattern 420. For example, a top surface of the second lower pattern 422e may contact a bottom surface of the first lower pattern 420. The second lower pattern 422e may be separated from an edge of the bottom surface of the first lower pattern 420 and from the first lower opening 420H, and may contact an inner portion of the bottom surface of the first lower pattern 420.

Therefore, the planar area of the second lower pattern 422e may be less than the planar area of the first lower pattern 420. For example, the area of the top surface of the second lower pattern 422e may be less than the area of bottom surface of the first lower pattern 420.

For example, the lower support pattern 430a including the first lower pattern 420 and the second lower pattern 422e may have a similar structure to the upper support pattern 450 including the first upper pattern 444 and the second upper pattern 442e.

Figure 14:
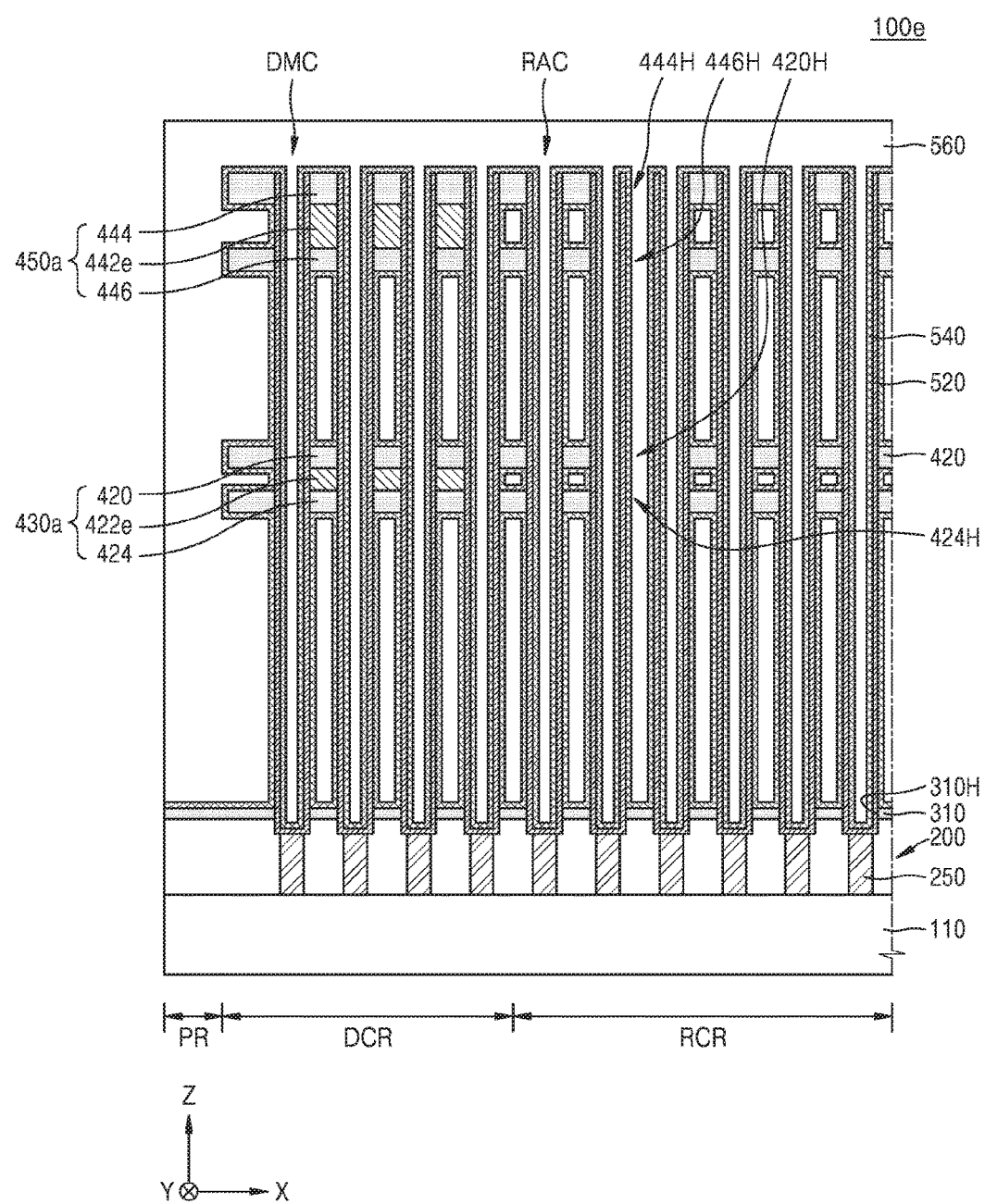

FIG. 14 is a cross-sectional view illustrating main components of a semiconductor device according to an embodiment. Repeated descriptions with reference to FIGS. 9 to 13 will be omitted.

Referring to FIG. 14, a semiconductor device 100e may include the lower structure 200 on the substrate 110, and the plurality of contact plugs 250 connected to the substrate 110 through the lower structure 200.

Support patterns 450a and 430a may contact the sidewalls of the plurality of first electrodes 520. The support patterns 450a and 430a may include the upper support pattern 450a and a lower support pattern 430a. The upper support pattern 450a and the lower support pattern 430a may be separated from one another. The upper support pattern 450a may contact the sidewalls of the upper ends of the plurality of first electrodes 520. The lower support pattern 430a may contact the sidewalls under the upper ends of the plurality of first electrodes 520.

Since the upper support pattern 450a is substantially the same as the upper support pattern 450a described with reference to FIG. 9, descriptions thereof will be omitted.

The lower support pattern 430a may include the first lower pattern 420, the second lower pattern 422e, and a third lower pattern 424. The first lower pattern 420 and the second lower pattern 422e may include different materials from each other. The third lower pattern 424 and the second lower pattern 422e may include different materials from each other. In some example embodiments, the first lower pattern 420 and the third lower pattern 424 may include the same material.

The lower support pattern 430a shown in FIG. 14 may further include the third lower pattern 424, unlike the lower support pattern 430a shown in FIG. 13. The first lower pattern 420 may have a first lower opening 420H penetrating the first lower pattern 420. The second lower pattern 422e may contact the first lower pattern 420.

The third lower pattern 424 may have the same planar shape as the first lower pattern 420 by transferring the planar shape of the first lower pattern 420 to the third lower pattern 424. The third lower pattern 424 may contact the second lower pattern 422e.

For example, the lower support pattern 430a may have a sandwich structure, in which the second lower pattern 422e is between the first lower pattern 420 and the third lower pattern 424.

For example, the lower support pattern 430a including the first lower pattern 420, the second lower pattern 422e, and the third lower pattern 424 may have a similar structure to the upper support pattern 450a including the first upper pattern 444, the second upper pattern 442e, and the third upper pattern 446.

Figure 15:
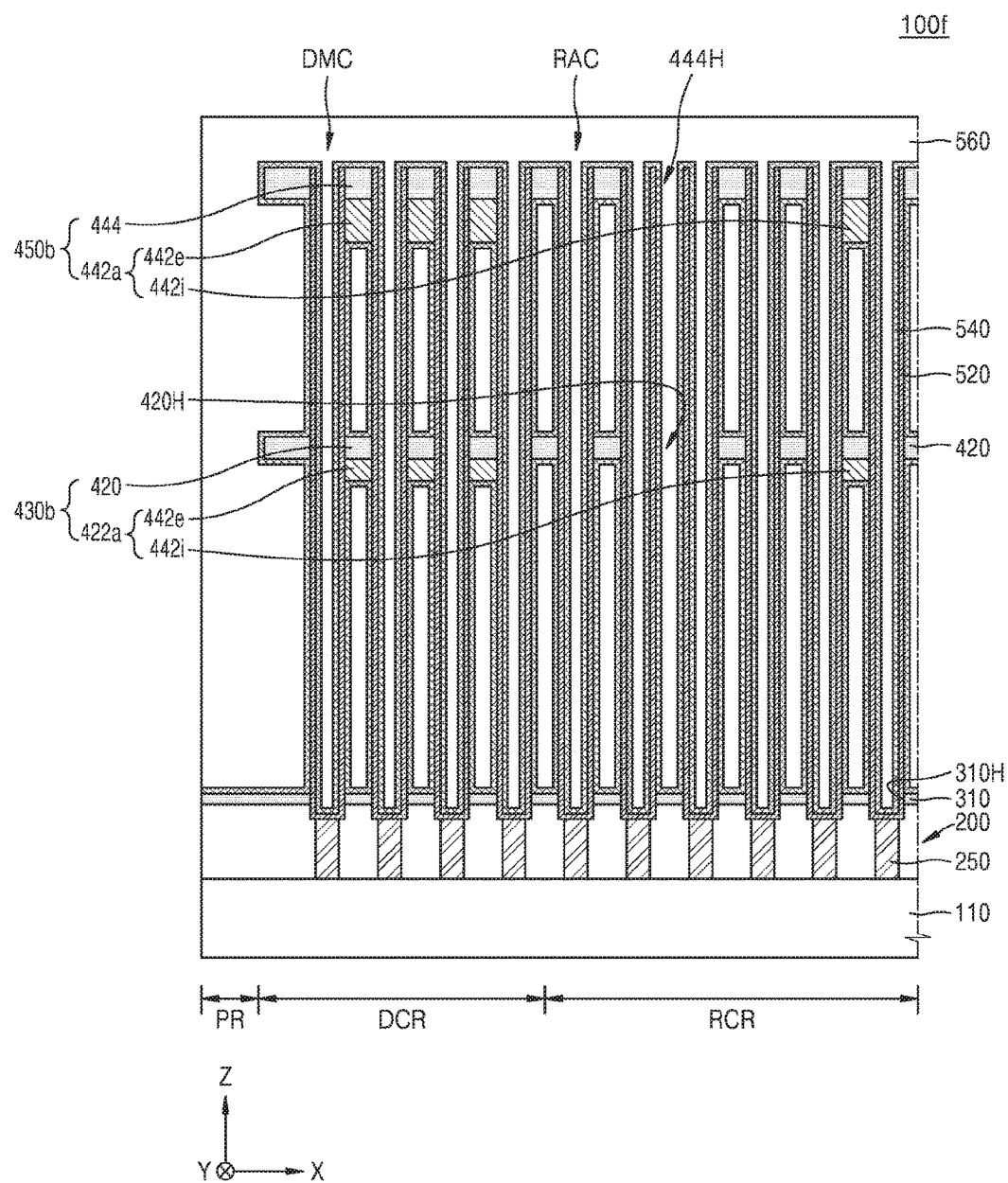

FIG. 15 is a cross-sectional view illustrating main components of a semiconductor device according to an embodiment. Repeated descriptions with reference to FIGS. 10 to 14 will be omitted.

Referring to FIG. 15, a semiconductor device 100f may include the lower structure 200 on the substrate 110, and the plurality of contact plugs 250 connected to the substrate 110 through the lower structure 200.

Support patterns 450b and 430b may contact the sidewalls of the plurality of first electrodes 520. The support patterns 450b and 430b may include the upper support pattern 450b and a lower support pattern 430b. The upper support pattern 450b and the lower support pattern 430b may be separated from one another.

The upper support pattern 450b may contact the sidewalls of the upper ends of the plurality of first electrodes 520. The lower support pattern 430b may contact the sidewalls under the upper ends of the plurality of first electrodes 520.

Since the upper support pattern 450b is substantially the same as the upper support pattern 450b described with reference to FIG. 10, descriptions thereof will be omitted.

The lower support pattern 430b may include the first lower pattern 420 and a second lower pattern 422a. The first lower pattern 420 and the second lower pattern 422a may include different materials from each other. The second lower pattern 422a may contact the first lower pattern 420.

The second lower pattern 422a may include a lower outer pattern 422e and a lower inner pattern 422i. Since the lower outer pattern 422e is substantially the same as the second lower pattern 422e described with reference to FIG. 13, descriptions thereof will be omitted. For example, the second lower pattern 422a of the semiconductor device 100f shown in FIG. 15 may further include the lower inner pattern 422i, unlike the second lower pattern 422e of the semiconductor device 100e shown in FIG. 13.

The lower inner pattern 422i may have an island shape separated from the lower outer pattern 422e. The lower inner pattern 422i may be separated from the first lower opening 420H and contact the bottom surface of the first lower pattern 420. The thickness of the lower outer pattern 422e may be substantially equal to the thickness of lower inner pattern 422i.

For example, the lower support pattern 430b including the first lower pattern 420 and the second lower pattern 422a may have a similar structure to the upper support pattern 450b including the first upper pattern 444 and the second upper pattern 442a.

Figure 16:
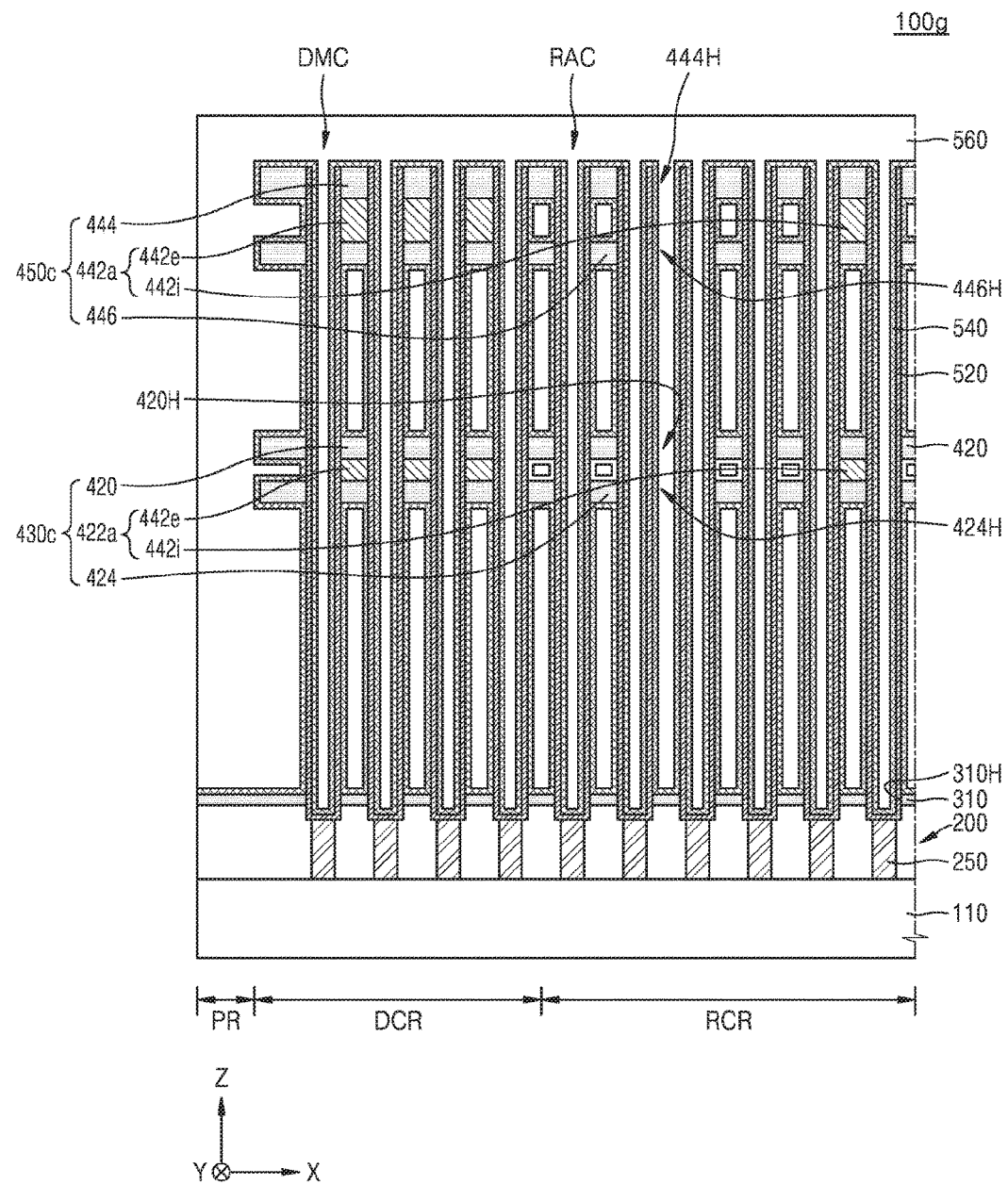

FIG. 16 is a cross-sectional view illustrating main components of a semiconductor device according to an embodiment. Repeated descriptions with reference to FIGS. 12 to 15 will be omitted.

Referring to FIG. 16, a semiconductor device 100g may include the lower structure 200 on the substrate 110, and the plurality of contact plugs 250 connected to the substrate 110 through the lower structure 200.

Support patterns 450c and 430c may contact the sidewalls of the plurality of first electrodes 520. The support patterns 450c and 430c may include the upper support pattern 450c and a lower support pattern 430c. The upper support pattern 450c and the lower support pattern 430c may be separated from one another.

The upper support pattern 450c may contact the sidewalls of the upper ends of the plurality of first electrodes 520. The lower support pattern 430c may contact the sidewalls under the upper ends of the plurality of first electrodes 520.

Since the upper support pattern 450c is substantially the same as the upper support pattern 450c described with reference to FIG. 12, descriptions thereof will be omitted.

The lower support pattern 430c may include the first lower pattern 420, the second lower pattern 422a, and the third lower pattern 424. The first lower pattern 420 and the second lower pattern 422a may include different materials from each other. The third lower pattern 424 and the second lower pattern 422a may include different materials from each other.

The second lower pattern 422a may contact the first lower pattern 420. The second lower pattern 422a may include the lower outer pattern 422e and the lower inner pattern 422i. Since the lower outer pattern 422e, the lower inner pattern 422i, and the third lower pattern 424 are respectively substantially the same as the second lower pattern 422e described with reference to FIG. 13, the lower inner pattern 422i described with reference to FIG. 15, and the third lower pattern 424 described with reference to FIG. 14, descriptions thereof will be omitted.

The lower support pattern 430c may have a sandwich structure, in which the second lower pattern 422a including the lower outer pattern 422e and the lower inner pattern 422i is between the first lower pattern 420 and the third lower pattern 424.

For example, the lower support pattern 430c including the first lower pattern 420, the second lower pattern 422a, and the third lower pattern 424 may have a similar structure to the upper support pattern 450c including the first upper pattern 444, the second upper pattern 442a, and the third upper pattern 446.

As described with reference to FIGS. 1 to 16, the semiconductor devices according to inventive concepts may have different proportions of portions of the sidewalls of the first electrodes, which contact the support patterns supporting the capacitors in the cell block of the semiconductor device.

If the proportion of the portions of the sidewalls of the first electrodes, which contact the support patterns, relatively increases, the capacitance of the capacitors may decrease. The decrease in capacitance may impair refresh performance of the semiconductor device.

However, in the semiconductor device according to inventive concepts, since the proportion of the support pattern-contacting portions of the sidewalls of the first electrodes of the functional capacitors is relatively lower than the proportion of the support pattern-contacting portions of the sidewalls of the first electrodes of the dummy capacitors, which are not directly used to operate the semiconductor device, the capacitance of the functional capacitors for the operation of the semiconductor device may be high. For example, the decrease in capacitance of the functional capacitors may impair the refresh performance of the semiconductor device.

If the proportion of the portions of the sidewalls of the first electrodes, which contact the support patterns, relatively decreases, the force, with which the support patterns support the capacitors, may decrease. In particular, since the dummy capacitors are arranged in the outer region of the cell block to surround the functional capacitors, the stress applied around the dummy capacitors may be relatively greater than the stress applied around the functional capacitors, in the cell block.

However, in the semiconductor device according to inventive concepts, since the proportion of the support pattern-contacting portions of the sidewalls of the first electrodes of the dummy capacitors is relatively higher than the proportion of the support pattern-contacting portions of the sidewalls of the first electrodes of the functional capacitors, the force, with which the support patterns support the dummy capacitors, may relatively increase.

Therefore, according to the semiconductor device according to inventive concepts, the support patterns support the capacitors to relax the stress applied to the capacitors included in the cell block, and the capacitance of the functional capacitors is sufficiently high, thereby improving the mechanical and electrical reliability of the semiconductor device. For example, improved capacitance of the functional capacitors may improve the refresh performance of the semiconductor device.

FIGS. 17 to 22 are cross-sectional views illustrating sequential processes of a method of fabricating a semiconductor device, according to an embodiment.

Figure 17:
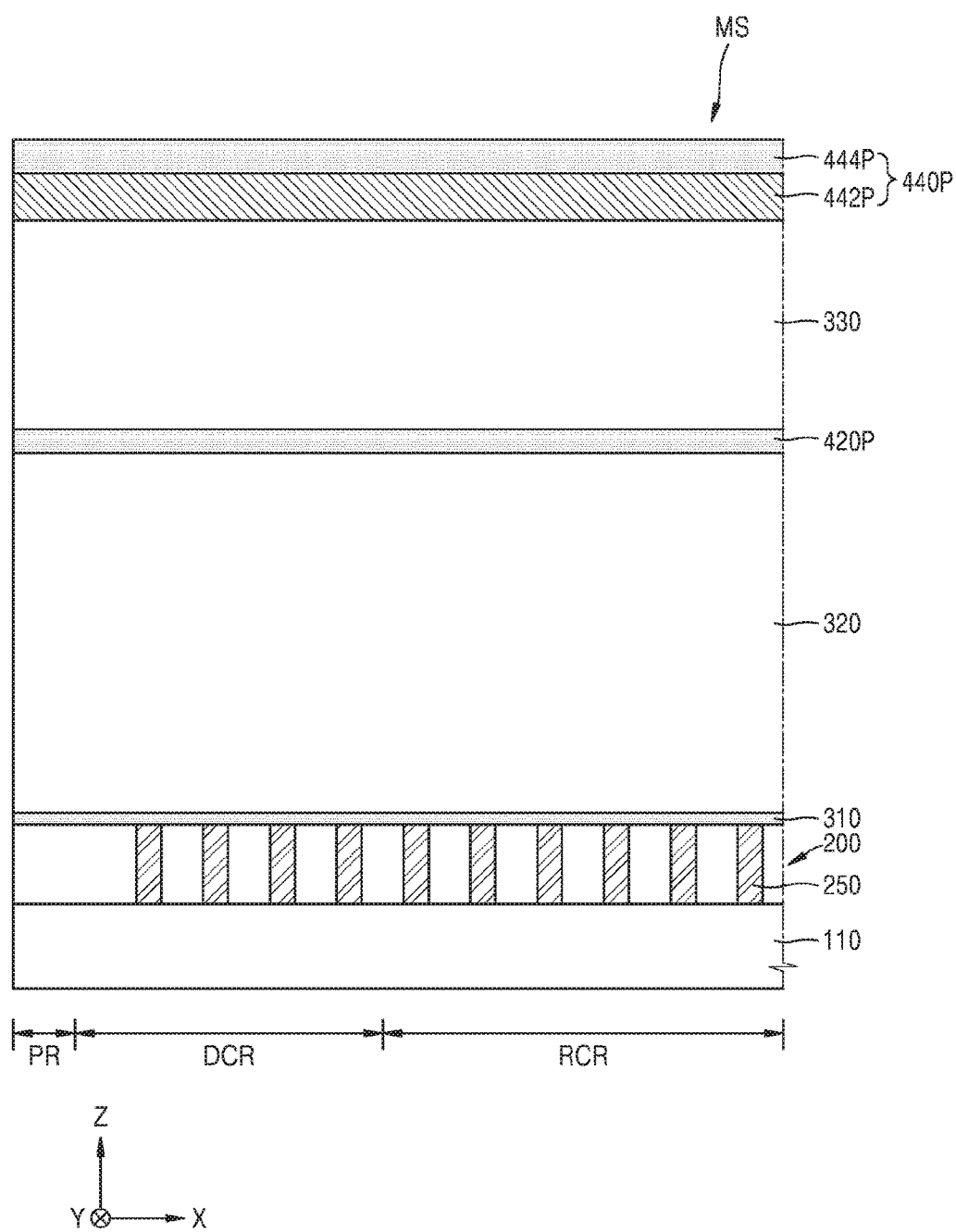
FIGS. 17 to 22 are cross-sectional views illustrating sequential processes of a method of fabricating a semiconductor device, according to an example embodiment.

Referring to FIG. 17, the lower structure 200, and the plurality of contact plugs 250 connected to the substrate 110 through the lower structure 200 are on the substrate 110.

Next, the etch stop film 310, a first mold layer 320, a lower support layer 420P, a second mold layer 330, and an upper support layer 440P including a first upper layer 444P and a second upper layer 442P under the first upper layer 444P are formed in this stated order and cover the lower structure 200 and the plurality of contact plugs 250, thereby forming a mold structure MS. The first mold layer 320 and second mold layer 330 may include materials having etch selectivity with respect to the lower support layer 420P and the upper support layer 440P. In some example embodiments, each of, or at least one of the first mold layer 320 and the second mold layer 330 may include a spin-on hard mask (SOH) material, a semiconductor oxide layer, and/or a semiconductor layer. The semiconductor oxide layer may include, for example, oxide such as tetraethyl orthosilicate (TEOS) oxide, high-density plasma (HDP) oxide, and/or the like. The semiconductor layer may include, for example, polysilicon, amorphous silicon, silicon-germanium, and/or the like. The first mold layer 320 and the second mold layer 330 may include the same material, although inventive concepts are not limited thereto, and may include different materials from each other. The semiconductor layer may be formed with chemical vapor deposition (CVD), atomic layer chemical vapor deposition (ALCVD,) deposition in a furnace, and/or other processes known in the art.

Figure 18:
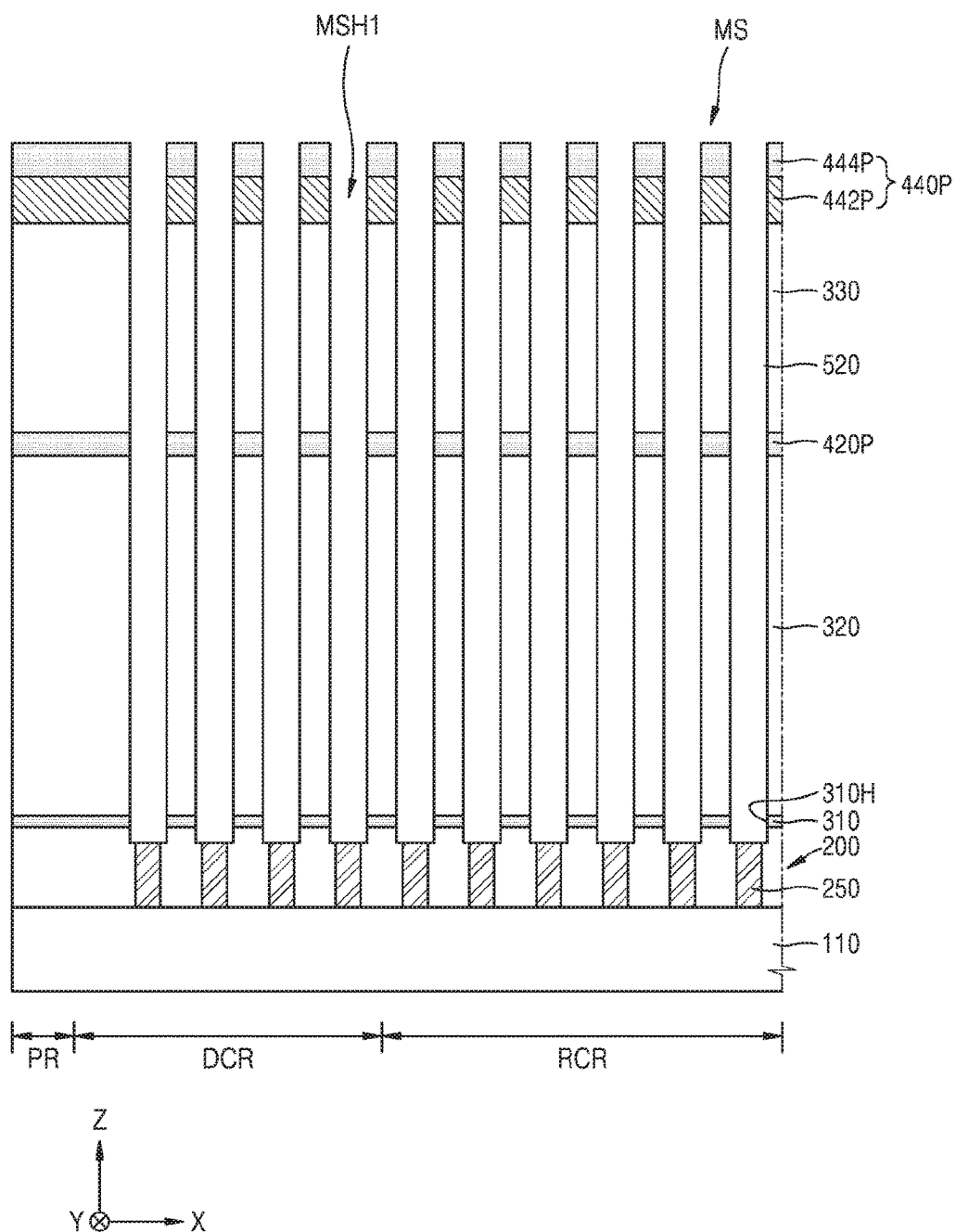

Referring to FIG. 18, a plurality of first mold holes MSH1 are formed, the plurality of first mold holes MSH1 penetrating the mold structure MS and exposing the plurality of contact plugs 250. In some example embodiments, the first mold holes MSH1 may extend beyond the bottom surface of the etch stop film 310 toward the substrate 110. A portion of a first mold hole MSH1, which extends from a top surface of the etch stop film 310 to a bottom surface of the first mold hole MSH1, may be referred to as a through-hole 310H.

Figure 19:
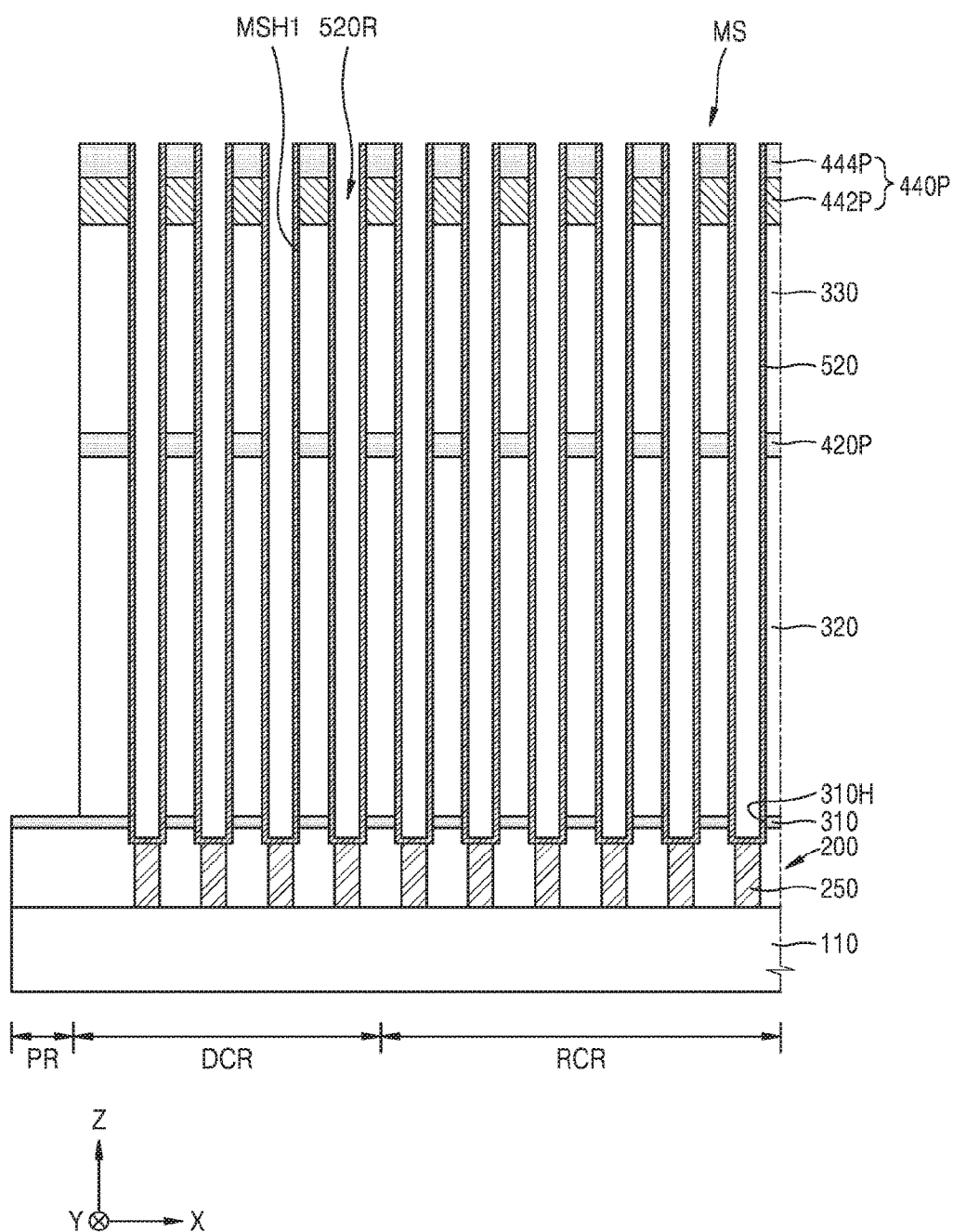

Referring to FIG. 19, the first electrodes 520 may be formed and conformally cover inner walls and bottom surfaces of the first mold holes MSH1. Lowermost ends of the first electrodes 520 may contact the top surfaces of the plurality of contact plugs 250.

Before or after the first electrodes 520 are formed, portions of the mold structure MS, which are formed in the peripheral regions PR, may be removed, thereby exposing a sidewall of the mold structure MS at a boundary between the peripheral regions PR and the cell block (SCB of FIGS. 1 and 2) including the functional capacitor region RCR and the dummy capacitor region DCR.

Figure 20:
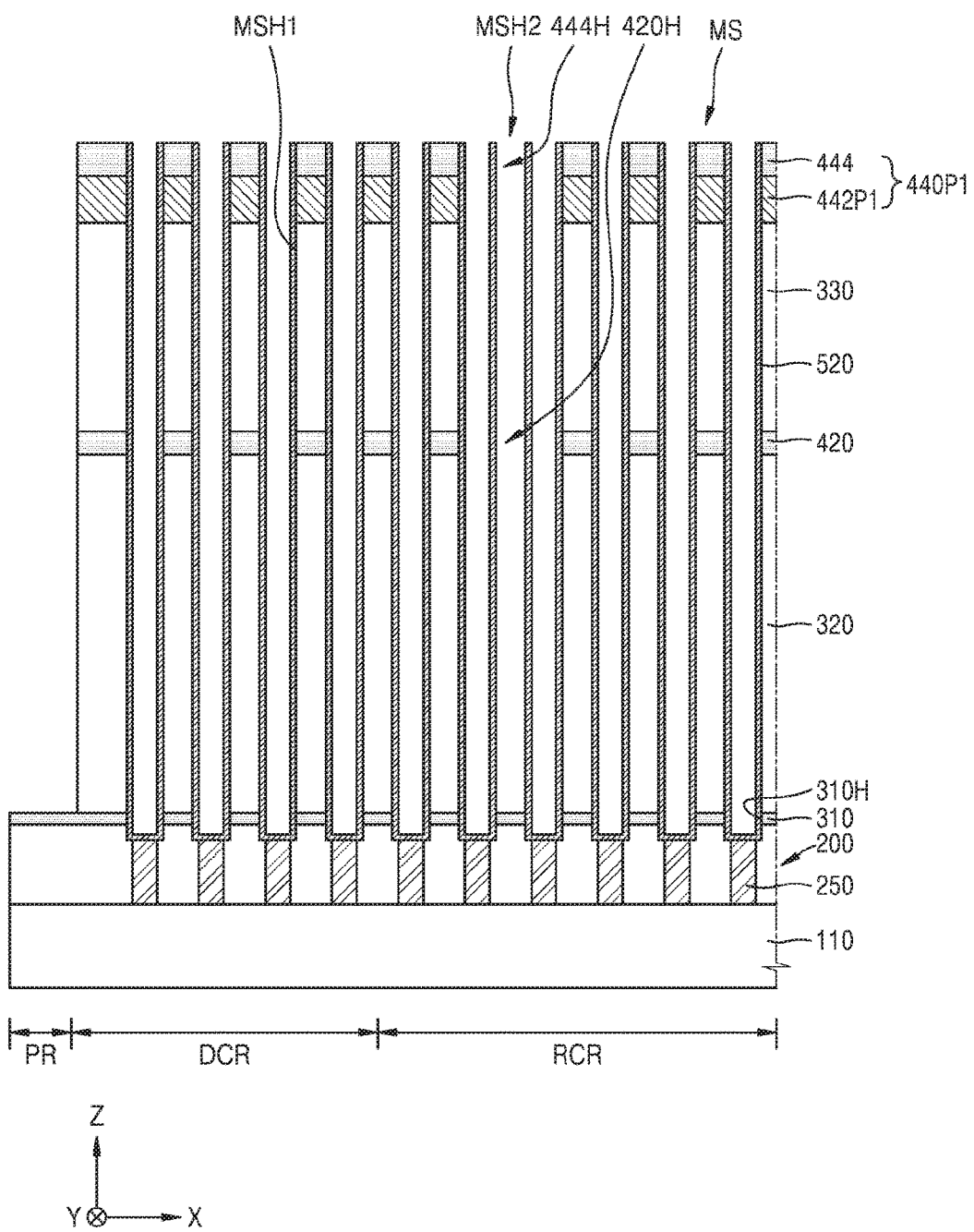

Referring to FIG. 20, a plurality of second mold holes MSH2 are formed, the plurality of second mold holes MSH2 penetrating the mold structure MS and exposing the etch stop film 310.

In the process of forming the first mold holes MSH1 and the second mold holes MSH2, portions of the lower support layer (420P of FIG. 19) and the upper support layer (440P of FIG. 19) are removed, thereby forming the lower support pattern 420 and a preliminary upper support pattern 440P1. The preliminary upper support pattern 440P1 may include the first upper pattern 444 and a preliminary second upper pattern 442P1.

A portion of a second mold hole MSH2, which penetrates the first upper pattern 444, may be referred to as the first upper opening 444H. A portion of the second mold hole MSH2, which penetrates the lower support pattern 420, may be referred to as the first lower opening 420H.

Figure 21:
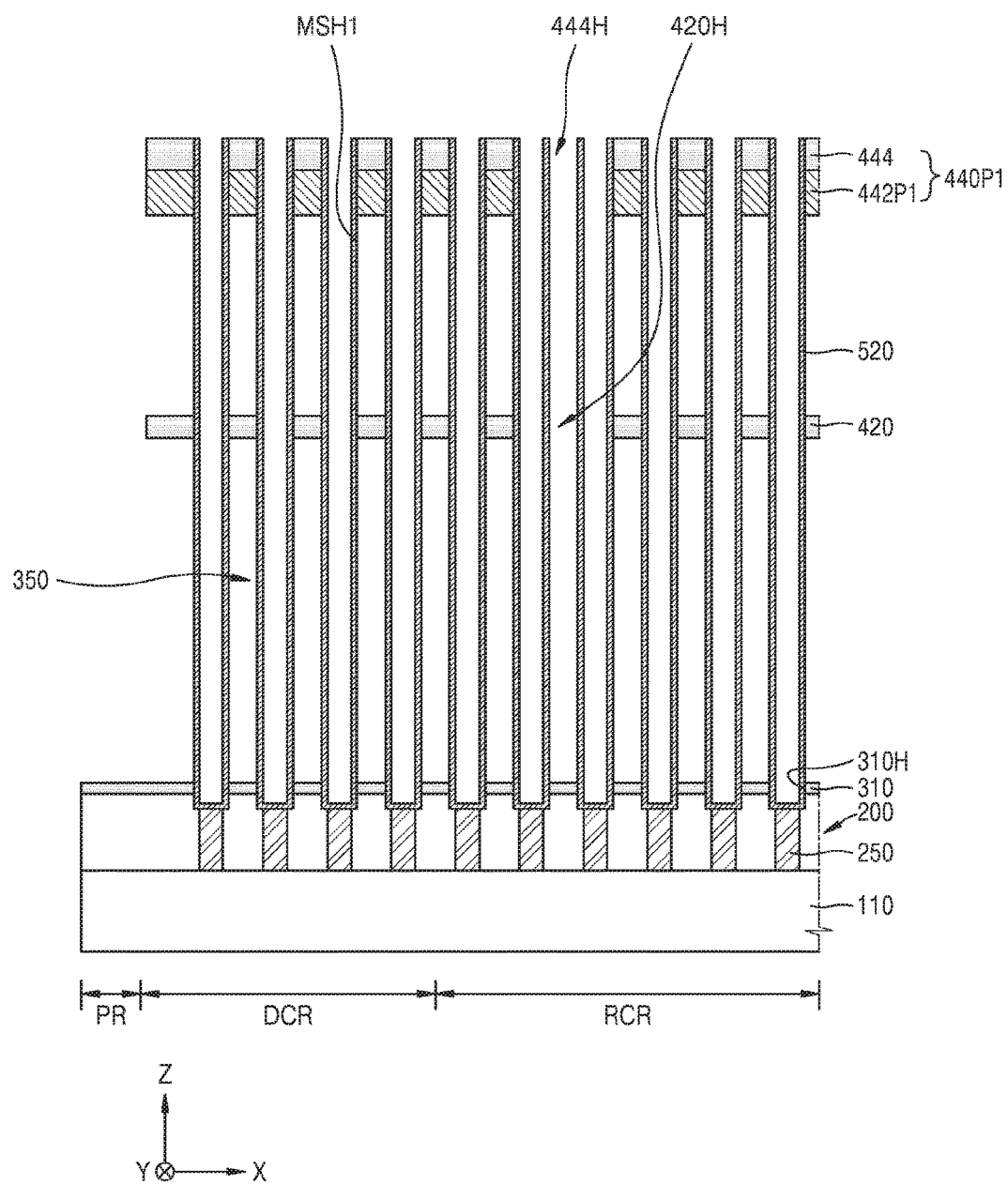

Referring to FIG. 21, the first mold layer (320 of FIG. 20) and the second mold layer (330 of FIG. 20) are removed through sidewalls of the second mold holes MSH2 and/or the mold structure (MS of FIG. 20), thereby forming a removal space 350. In some example embodiments, a process of removing the first mold layer 320 and the second mold layer 330 may be performed by wet etching, for example, wet etching with a chemical such as a buffered oxide etchant, and/or a chemical including hydrogen fluoride and/or ammonium fluoride.

Figure 22:
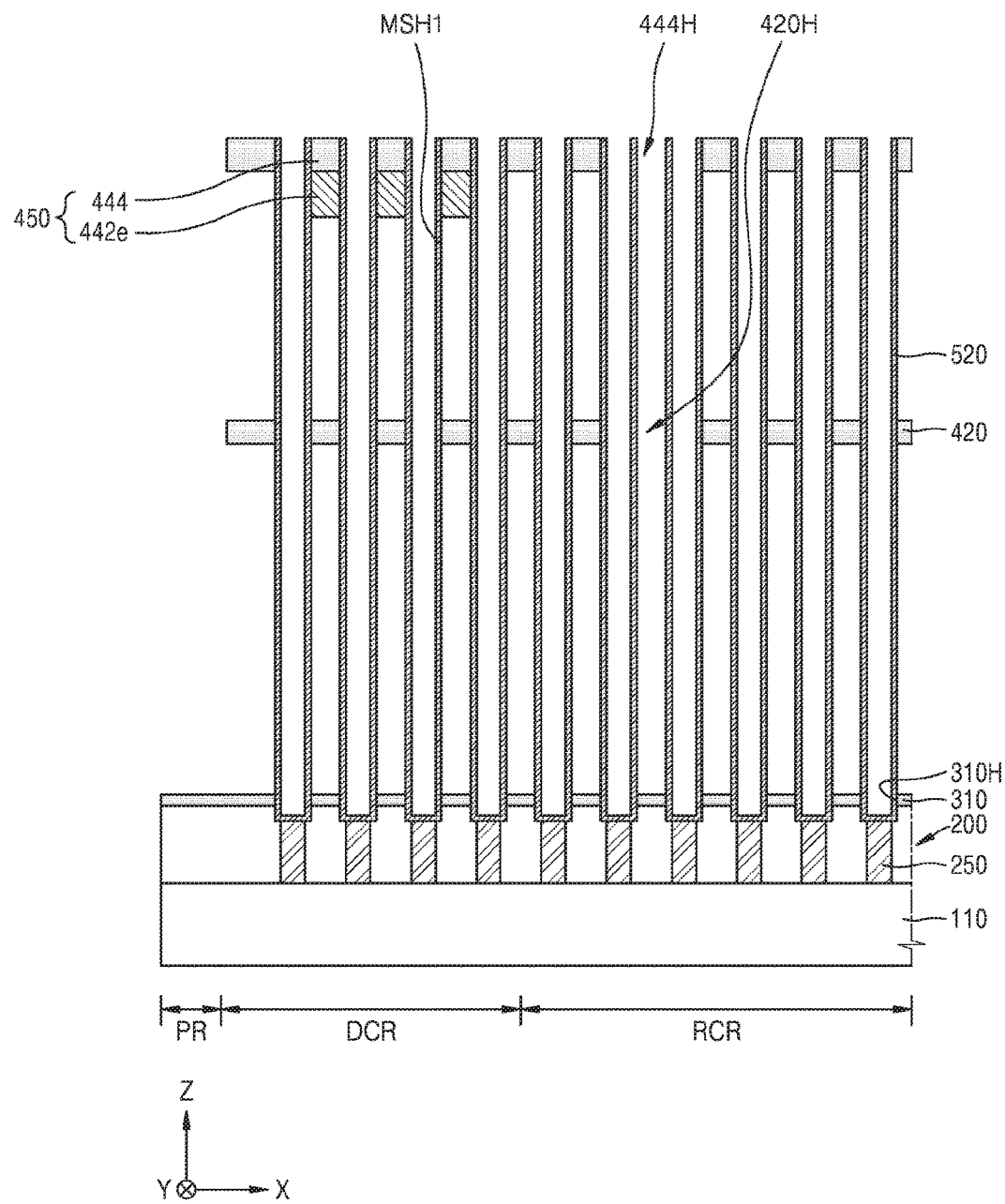

Referring to FIG. 22, a portion of the preliminary second upper pattern (442P1 of FIG. 21) is removed, thereby forming the second upper pattern 442e. In this way, the upper support pattern 450 including the first upper pattern 444 and the second upper pattern 442e may be formed.

A portion of the preliminary second upper pattern 442P1 is removed from a sidewall of the preliminary second upper pattern 442P1 by supplying an etching solution or etching gas, which allows the preliminary second upper pattern 442P1 to have etch selectivity with respect to the first upper pattern 444, through the removal space (350 of FIG. 21), which communicates through, or is contiguous with, the first upper opening 444H, and a boundary between the dummy capacitor region DCR and the peripheral region PR, thereby forming the second upper pattern 442e.

Next, as shown in FIG. 5, the dielectric film 540, which conformally covers the first electrodes 520 and the support patterns 450 and 420, and the second electrode 560 covering the dielectric film 540 are formed, thereby forming the semiconductor device 100. The dielectric film 540 may be formed with ALCVD. The second electrode 560 may be formed with a physical vapor deposition (PVD) process or a plasma-enhanced chemical vapor deposition (PECVD) process. However, inventive concepts are not limited thereto.

The semiconductor device 100a shown in FIG. 9 may be formed by forming a third upper layer for forming the third upper pattern 446 under the second upper layer 442P shown in FIG. 17, followed by performing subsequent processes.

The semiconductor device 100b shown in FIG. 10 may be formed by relatively reducing an amount of the removed portion of the preliminary second upper pattern (442P1 of FIG. 21) in the process of removing the portion of the preliminary second upper pattern 442P1, as described with reference to FIG. 22.

The semiconductor device 100c shown in FIG. 11 may be formed by combining the method of forming the semiconductor device 100a shown in FIG. 9 with the method of forming the semiconductor device 100b shown in FIG. 10.

The semiconductor device 100d shown in FIG. 13 may be formed by forming a first lower layer and a second lower layer, which respectively have similar properties to the first upper layer 444P and the second upper layer 442P, instead of the lower support layer 420P, the second lower layer being under the first lower layer.

The semiconductor device 100e shown in FIG. 14 may be formed by forming the third upper layer described in the method of forming the semiconductor device 100a shown in FIG. 9 and by forming a third lower layer having similar properties to the third upper layer under the second upper layer described in the method of forming the semiconductor device 100d shown in FIG. 13.

The semiconductor devices 100f and 100g shown in FIGS. 15 and 16 may be formed by combining the methods of forming the semiconductor devices 100d and 100e shown in FIGS. 13 and 14 with the method of forming the semiconductor device 100b shown in FIG. 10.

Figure 23:
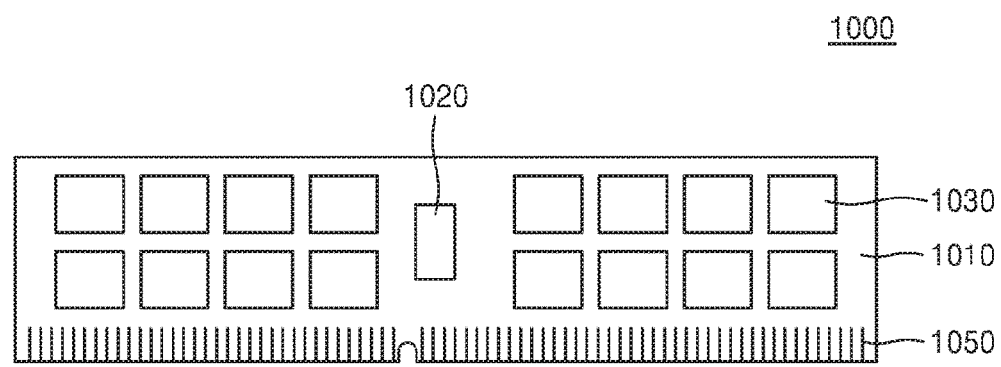
FIG. 23 is a plan view illustrating main components of a semiconductor device according to an example embodiment.

FIG. 23 is a plan view illustrating main components of a semiconductor module according to an embodiment.

Referring to FIG. 23, a semiconductor module 1000 includes a module substrate 1010, and a control chip 1020 and a plurality of semiconductor packages 1030, which are mounted on the module substrate 1010. A plurality of input/output terminals 1050 are formed in the module substrate 1010.

The plurality of semiconductor packages 1030 include at least one of the semiconductor devices 100, 100a, 100b, 100c, 100d, 100e, 100f, and 100g described with reference to FIGS. 1 to 22.

Figure 24:
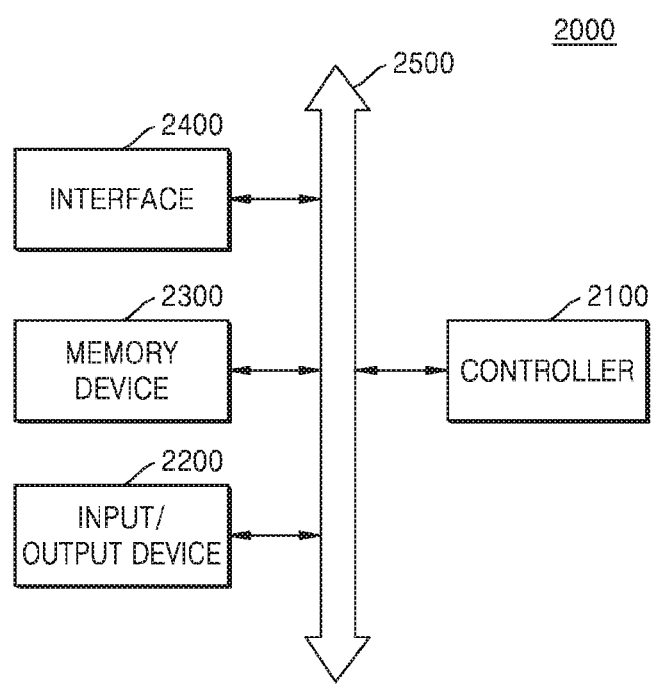
FIG. 24 is a block diagram illustrating a system including a semiconductor device according to an example embodiment.

FIG. 24 is a block diagram illustrating a system including a semiconductor device according to an embodiment.

Referring to FIG. 24, a system 2000 includes a controller 2100, an input/output device 2200, a memory device 2300, and an interface 2400. The system 2000 may be or may include a mobile system or a system transmitting or receiving information. In some example embodiments, the mobile system is a PDA, a portable computer, a web tablet, a wireless phone, a mobile phone, a digital music player, or a memory card. The controller 2100 is for controlling programs executed in the system 2000 and may include a microprocessor, a digital signal processor, a microcontroller, or a device similar thereto. The input/output device 2200 may be used to input or output data of the system 2000. The system 2000 may be connected to a device external to the system 2000, for example, to a personal computer or a network, by using the input/output device 2200, and may exchange data with the external device. The input/output device 2200 may be, for example, a keypad, a keyboard, or a display.

The memory device 2300 may store codes and/or data for operations of the controller 2100 or may store data which has been processed by the controller 2100. The memory device 2300 includes the semiconductor device according to example embodiments. For example, the memory device 2300 includes at least one of the semiconductor devices 100, 100a, 100b, 100c, 100d, 100e, 100f, and 100g described with reference to FIGS. 1 to 22.

The interface 2400 may be or may include a data transmitting path between the system 2000 and other devices external to the system 2000. The controller 2100, the input/output device 2200, the memory device 2300, and the interface 2400 may communicate with each other through a bus 2500. The system 2000 may be used for a mobile phone, an MP3 player, a navigation system, a portable multimedia player (PMP), a solid state disk (SSD), or household appliances.

While inventive concepts have been particularly shown and described with reference to example embodiments thereof, it will be understood that various changes in form and details may be made therein without departing from the spirit and scope of the following claims.

What is claimed is:

1. A semiconductor device comprising:
a substrate having a cell block;
a plurality of capacitors in the cell block, the plurality of capacitors extending in a first direction and having first electrodes, the first electrodes having upper ends further from a surface of the substrate, the first electrodes having sidewalls; and
a support pattern contacting sidewalls of the first electrodes of the plurality of capacitors and configured to support the plurality of capacitors,
the support pattern including an upper support pattern, the upper support, pattern including,
a first upper pattern having a top surface and a bottom surface, the top surface and the bottom surface parallel to the surface of the substrate, the top surface and the bottom surface having a plate-like structure when viewed from a plan view above a surface of the substrate, the plate-like structure extending in a second direction perpendicular to the first direction and extending in a third direction perpendicular to the first direction and the second direction and connected contiguously in the cell block, and
a second upper pattern contacting the bottom surface of the first upper pattern and having a top surface, the top surface of the second upper pattern having a smaller surface area than a surface area of the bottom surface of the first upper pattern when viewed from the plan view,
the upper support pattern contacting sidewalls of upper, ends of the first electrodes.

2. The semiconductor device according to claim 1, wherein, when viewed from the first direction, the second upper pattern is separate from an edge of the bottom surface of the first upper pattern and the second upper pattern contacts an inner portion of the bottom surface of the first upper pattern.

3. The semiconductor device according to claim 1, wherein the second upper pattern includes an upper Outer pattern contacting the first electrodes of the capacitors, which, when viewed from the first direction, are adjacent to a corner of the bottom surface of the first upper pattern and adjacent to at least a portion of an edge of the bottom surface of the first upper pattern, the edge being connected to the corner.

4. The semiconductor device according to claim 1, wherein the upper support pattern further includes a third upper pattern configured to contact a bottom surface of the second upper pattern and having a top surface having a larger surface area than the bottom surface of the second upper pattern, when viewed from the first direction.

5. The semiconductor device according to claim 4, wherein the third upper pattern has a same planar shape as the first upper pattern when viewed from the first direction.

6. The semiconductor device according to claim 1, wherein the support pattern further includes a lower support pattern contacting sidewalls under the upper ends of the first electrodes of the plurality of capacitors and having a same planar shape as the first upper pattern.

7. The semiconductor device according to claim 1, wherein the plurality of capacitors includes a plurality of functional capacitors in an inner region of the cell block, and a plurality of dummy capacitors in an outer region of the cell block and surrounding the plurality of functional capacitors, the first upper pattern simultaneously supporting at least some of the plurality of functional capacitors and at least some of the plurality of dummy capacitors, and the second upper pattern supporting at least some of the plurality of dummy capacitors.

8. The semiconductor device according to claim 7, wherein the second upper pattern continuously surrounds the plurality of functional capacitors.

9. A semiconductor device comprising:
a substrate having a plurality of sub-cell blocks separated from one another by a peripheral region;
a plurality of capacitors in the sub-cell blocks of the substrate, the plurality of capacitors each including a cylindrical first electrode, and a second electrode, the second electrode facing the first electrode, a dielectric film between the second electrode and the first electrode, the first electrode including upper ends further from a surface of the substrate; and
a support pattern contacting outer sidewalls upper ends of the first electrodes of the capacitors in the respective plurality of sub-cell blocks and supporting the plurality of capacitors,
the support pattern including,
an upper support pattern including a first upper pattern contacting the outer sidewalls of the upper ends of the first electrodes and has a plate-like structure when viewed from a plan view above a surface of the substrate, the plate-like structure connected as a whole in each of the sub-cell blocks, and a second upper pattern contacting a portion of a bottom surface of the first upper pattern, the portion of the bottom surface of the first upper pattern being separated from an edge of the bottom surface of the first upper pattern, and
a lower support pattern contacting outer sidewalls of the first electrode and closer to the surface of the substrate than the upper support pattern.

10. The semiconductor device according to claim 9, wherein the second upper pattern includes a different material from the first upper pattern.

11. The semiconductor device according to claim 9, wherein the plurality of capacitors includes a plurality of functional capacitors and a plurality of dummy capacitors, and the second upper pattern includes an upper outer pattern adjacent to an edge of the bottom surface of the first upper pattern, the edge viewed from the bottom surface of the first upper pattern, the upper outer pattern supporting the plurality of dummy capacitors and surrounding the plurality of functional capacitors.

12. The semiconductor device according to claim 11, wherein the first upper pattern includes a plurality of upper openings, and the second upper pattern contacts at least one portion of the bottom surface of the first upper pattern being separated from the upper openings.

13. The semiconductor device according to claim 12, wherein the second upper pattern further includes a plurality of upper outer patterns supporting some of the plurality of functional capacitors, the plurality of upper outer patterns having island shapes.

14. The semiconductor device according to claim 9, wherein the upper support pattern further includes a third upper pattern contacting a bottom surface of the second upper pattern and having plate-like structure connected contiguously in each of the sub-cell blocks.

15. The semiconductor device according to claim 9, wherein the lower support pattern includes:
a rust lower pattern having a same planar shape when viewed from a direction vertical to a surface of the substrate as the first upper pattern, and
a second lower pattern contacting a portion of a bottom surface of the first lower pattern separated from an edge of the bottom surface of the first lower pattern.

16. A semiconductor device comprising:
a substrate;
at least one dummy capacitor connected to the substrate, the at least one dummy capacitor electrically isolated from other components during an operation of the semiconductor device;
at least one functional capacitor, the at least one functional, capacitor connected to the substrate, the at least one functional capacitor electrically connected to store charge during the operation of the semiconductor device;
at least one first upper pattern supporting the at least, one functional capacitor and supporting the at least one dummy capacitor; and
at least one second upper pattern supporting the at least one dummy capacitor and not supporting the at least one functional capacitor.

17. The semiconductor device of claim 16, wherein the at least one dummy capacitor is configured to provide mechanical support to the semiconductor device.

18. The semiconductor device of claim 16, wherein the at least one dummy capacitor is configured to improve photolithographic margins to the device.

19. The semiconductor device of claim 16, wherein the at least one functional capacitor is configured to be used in an operation of a DRAM memory cell.

20. A semiconductor package comprising:
a module substrate; and
the semiconductor device of claim 16 mounted on the module substrate.

* * * * *

UNITED STATES PATENT AND TRADEMARK OFFICE
CERTIFICATE OF CORRECTION

PATENT NO. : 10,468,415 B2  
APPLICATION NO. : 15/834203  
DATED : November 5, 2019  
INVENTOR(S) : Hee-wook You et al.

Page 1 of 1

It is certified that error appears in the above-identified patent and that said Letters Patent is hereby corrected as shown below:

In the Claims

1. At Column 24, Claim number 1, Line number 18, "support, pattern" should be changed to --support pattern including--.

2. At Column 24, Claim number 1, Line number 23, please change "above a surface" should be replaced with --above the surface--.

3. At Column 24, Claim number 1, Line number 35, "sidewalls of upper," should read --sidewalls of upper--.

4. At Column 24, Claim number 3, Line number 44, "upper Outer" should read --upper outer--.

5. At Column 24, Claim number 3, Line number 46, "are adjacent to" should read --is adjacent to--.

6. At Column 25, Claim number 9, Line number 21, "outer sidewalls upper" should read --outer sidewalls of upper--.

7. At Column 25, Claim number 9, Line number 28, "first electrodes" should read --first electrode--.

8. At Column 25, Claim number 9, Line number 29, "above a surface" should read --above the surface--.

Signed and Sealed this  
First Day of April, 2025

Coke Morgan Stewart  
*Acting Director of the United States Patent and Trademark Office*